(12) United States Patent
Seo et al.

(10) Patent No.: US 10,236,056 B2
(45) Date of Patent: *Mar. 19, 2019

(54) VOLATILE MEMORY DEVICE AND SYSTEM-ON-CHIP INCLUDING THE SAME

(71) Applicant: Samsung Electronics Co., Ltd., Suwon-si, Gyeonggi-do (KR)

(72) Inventors: Dong-Wook Seo, Hwaseong-si (KR); Jae-Seung Choi, Suwon-si (KR); Hyun-Su Choi, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/428,520

(22) Filed: Feb. 9, 2017

(65) Prior Publication Data

US 2017/0154673 A1 Jun. 1, 2017

Related U.S. Application Data

(63) Continuation of application No. 14/614,504, filed on Feb. 5, 2015, now Pat. No. 9,595,307.

(Continued)

(30) Foreign Application Priority Data

Aug. 4, 2014 (KR) .......................... 10-2014-0099854

(51) Int. Cl.
 *G11C 7/22* (2006.01)
 *G11C 11/419* (2006.01)
 *G11C 5/14* (2006.01)

(52) U.S. Cl.
 CPC .............. *G11C 11/419* (2013.01); *G11C 7/22* (2013.01); *G11C 7/222* (2013.01); *G11C 5/14* (2013.01)

(58) Field of Classification Search
 CPC ...................................................... G11C 7/222

(Continued)

(56) References Cited

U.S. PATENT DOCUMENTS 5,815,043 A 9/1998 Chow et al.
7,589,993 B2 9/2009 Yamaoka et al.
(Continued)

FOREIGN PATENT DOCUMENTS

JP 2008-135169 A 6/2008
JP 4162076 B2 10/2008
(Continued)

*Primary Examiner* — Hoai V Ho
*Assistant Examiner* — Jay Radke
(74) *Attorney, Agent, or Firm* — Harness, Dickey & Pierce, P.L.C.

(57) ABSTRACT

A volatile memory device includes a memory cell array configured to be supplied with a first power supply voltage through a first power supply line, and configured to store data based on the first power supply line; and a peripheral circuit configured to be supplied with a second power supply voltage through a second power supply line, and configured to control the memory cell array based on the second power supply line, the peripheral circuit including a self timing pulse circuit configured to determine an operation timing of the peripheral circuit, the self timing pulse circuit configured to be supplied with the first power supply voltage through the first power supply line, and the self timing pulse circuit being configured to adjust the operation timing of the peripheral circuit according to the voltage level of the first power supply voltage.

17 Claims, 14 Drawing Sheets

Related U.S. Application Data

(60) Provisional application No. 62/001,817, filed on May 22, 2014.

(58) Field of Classification Search
USPC .................................. 365/193, 228, 189.09
See application file for complete search history.

(56) References Cited

U.S. PATENT DOCUMENTS

| | | | |
|---|---|---|---|
| 7,630,229 B2 | 12/2009 | Katayama | |
| 7,746,717 B1 | 6/2010 | Peng et al. | |
| 7,920,438 B2 | 4/2011 | Yamaoka et al. | |
| 7,952,910 B2 | 5/2011 | Lih et al. | |
| 8,139,426 B2 | 3/2012 | Park et al. | |
| 8,339,892 B2 | 12/2012 | Kishibe | |
| 8,665,658 B2 | 3/2014 | Chen | |
| 8,705,268 B2 | 4/2014 | Buer et al. | |
| 2002/0034093 A1* | 3/2002 | Shiomi | G11C 11/412 365/154 |
| 2002/0186581 A1* | 12/2002 | Yamaoka | G11C 11/412 365/154 |
| 2003/0120958 A1* | 6/2003 | Zhang | G06F 1/3203 713/300 |
| 2004/0041608 A1* | 3/2004 | Jinbo | G11C 8/18 327/172 |
| 2004/0100840 A1 | 5/2004 | Chang et al. | |
| 2004/0143769 A1* | 7/2004 | Deng | G11C 5/14 713/300 |
| 2006/0152262 A1* | 7/2006 | Park | G11C 7/08 327/172 |
| 2006/0197571 A1 | 9/2006 | Kim | |
| 2008/0002501 A1* | 1/2008 | Lee | G11C 7/02 365/208 |
| 2008/0279017 A1 | 11/2008 | Shimano et al. | |
| 2008/0303494 A1* | 12/2008 | Nakakubo | G11C 11/406 323/272 |
| 2010/0214866 A1* | 8/2010 | Zhang | G11C 7/02 365/233.12 |
| 2011/0310684 A1* | 12/2011 | Yamagami | H01L 27/0207 365/194 |
| 2013/0077387 A1 | 3/2013 | Yabuuchi | |
| 2014/0089593 A1* | 3/2014 | Vera | G06F 11/08 711/133 |

FOREIGN PATENT DOCUMENTS

| | | |
|---|---|---|
| JP | 5373567 B2 | 12/2013 |
| KR | 2013-0032263 A | 4/2013 |
| KR | 2013-0075643 A | 7/2013 |

* cited by examiner

VOLATILE MEMORY DEVICE AND SYSTEM-ON-CHIP INCLUDING THE SAME

CROSS-REFERENCE TO RELATED APPLICATIONS

This U.S. non-provisional application is a continuation of U.S. application Ser. No. 14/614,504 filed on Feb. 5, 2015, which claims the benefit of priority under 35 U.S.C. § 119 to U.S. Provisional Application No. 62/001,817 filed on May 22, 2014 in the USPTO, and Korean Patent Application No. 10-2014-0099854 filed on Aug. 4, 2014 in the Korean Intellectual Property Office (KIPO), the entire contents of each of which are incorporated by reference herein in their entireties.

BACKGROUND

1. Technical Field

Example embodiments relate generally to semiconductor devices, and more particularly to volatile memory devices and system-on-chips including the volatile memory devices.

2. Description of the Related Art

A volatile memory device should be continuously supplied with power to retain stored data. A voltage level of a power supply voltage supplied to the volatile memory device has been decreased to reduce power consumption. However, as the semiconductor process technology has been advanced, a distribution of characteristics of memory cells of the volatile memory device has widened. Accordingly, operation stability of the memory cells may not be ensured at the decreased power supply voltage.

SUMMARY

Some example embodiments provide a volatile memory device having operation stability while maintaining or improving operation performance.

Some example embodiments provide a system-on-chip (SoC) including a volatile memory device having operation stability while maintaining or improving operation performance.

According to one or more example embodiments, a volatile memory device includes a memory cell array configured to be supplied with a first power supply voltage through a first power supply line, and configured to store data based on the first power supply voltage; and a peripheral circuit configured to be supplied with a second power supply voltage through a second power supply line, and configured to control the memory cell array based on the second power supply voltage, the peripheral circuit including a self timing pulse circuit configured to determine an operation timing of the peripheral circuit, the self timing pulse circuit configured to be supplied with the first power supply voltage through the first power supply line, and the self timing pulse circuit being configured to adjust the operation timing of the peripheral circuit according to a voltage level of the first power supply voltage.

The peripheral circuit may include an internal clock generator, the internal clock generator includes the self timing pulse circuit, and the internal clock generator is configured to generate an internal clock signal having a pulse width that is adjusted according to the voltage level of the first power supply voltage.

The self timing pulse circuit may be configured to advance the operation timing (or increase the operation speed) of the peripheral circuit as the voltage level of the first power supply voltage increases, and delay the operation timing of the peripheral circuit as the voltage level of the first power supply voltage decreases.

The self timing pulse circuit may be configured to delay a start timing of a sensing operation for reading the data stored in the memory cell array as the voltage level of the first power supply voltage decreases.

The self timing pulse circuit may be configured to delay an end timing of a write operation for writing the data into the memory cell array as the voltage level of the first power supply voltage decreases.

The internal clock generator may be configured to decrease the pulse width of the internal clock signal as the voltage level of the first power supply voltage increases, and increase the pulse width of the internal clock signal as the voltage level of the first power supply voltage decreases.

The internal clock generator may include a pull-up transistor configured to pull up the internal clock signal to a voltage level of the second power supply voltage in response to an external clock signal; a first level shifter configured to convert a voltage level of the internal clock signal from the voltage level of the second power supply voltage to the voltage level of the first power supply voltage, the self timing pulse circuit being configured to be supplied with the first power supply voltage through the first power supply line, and configured to generate a self timing pulse by delaying the internal clock signal having the voltage level of the first power supply voltage; a second level shifter configured to convert a voltage level of the self timing pulse from the voltage level of the first power supply voltage to the voltage level of the second power supply voltage; and a pull-down transistor configured to pull down the internal clock signal to a voltage level of a ground voltage in response to the self timing pulse having the voltage level of the second power supply voltage.

The self timing pulse circuit may include a delay line, the delay line configured to, receive the first power supply voltage through the first power supply line, receive the internal clock signal having the voltage level of the first power supply voltage from the first level shifter, and generate the self timing pulse by delaying the internal clock signal having the voltage level of the first power supply voltage.

The delay line may include a plurality of serially connected buffers configured to receive the first power supply voltage through the first power supply line.

The internal clock generator may further include an inverter configured to invert a chip enable signal; and a NAND gate configured to perform a NAND operation on the inverted chip enable signal and the external clock signal, the NAND gate having an output terminal coupled to a gate terminal of the pull-up transistor.

The internal clock generator may be configured to selectively adjust the pulse width of the internal clock signal in response to a write enable signal such that, the internal clock generator generates the internal clock signal based on the second power supply voltage when the write enable signal indicates a write mode, and the internal clock generator adjusts the pulse width of the internal clock signal according to the voltage level of the first power supply voltage when the write enable signal indicates a read mode.

The internal clock generator may include a pull-up transistor configured to pull up the internal clock signal to a voltage level of the second power supply voltage in response to an external clock signal; a first level shifter configured to convert a voltage level of the internal clock signal from the voltage level of the second power supply voltage to the voltage level of the first power supply voltage, the self timing pulse circuit being configured to, receive the first power supply voltage through the first power supply line, receive the second power supply voltage through the second power supply line, generate a first self timing pulse by delaying the internal clock signal having the voltage level of the first power supply voltage that is received from the first level shifter, and generate a second self timing pulse by delaying the internal clock signal having the voltage level of the second power supply voltage that is received from the pull-up transistor; a second level shifter configured to convert a voltage level of the first self timing pulse from the voltage level of the first power supply voltage to the voltage level of the second power supply voltage; a switch configured to, receive the first self timing pulse from the second level shifter, receive the second self pulse timing pulse from the self timing pulse circuit, output the second self timing pulse when the write enable signal indicates a write mode, and output the first self timing pulse when the write enable signal indicates a read mode; and a pull-down transistor configured to pull down the internal clock signal to a voltage level of a ground voltage in response to one of the first and second self timing pulses that is received from the switch.

The self timing pulse circuit may include a first delay line configured to, receive the first power supply voltage through the first power supply line, receive the internal clock signal having the voltage level of the first power supply voltage from the first level shifter, and generate the first self timing pulse by delaying the internal clock signal having the voltage level of the first power supply voltage; and a second delay line being configured to, receive the second power supply voltage through the second power supply line, receive the internal clock signal having the voltage level of the second power supply voltage from the pull-up transistor, and generate the second self timing pulse by delaying the internal clock signal having the voltage level of the second power supply voltage.

The internal clock generator may be configured to selectively adjust the pulse width of the internal clock signal in response to a pulse control signal received from an external processing block such that the internal clock generator generates the internal clock signal based on the second power supply voltage when the pulse control signal has a first logic level, and the internal clock generator adjusts the pulse width of the internal clock signal according to the voltage level of the first power supply voltage when the pulse control signal has a second logic level.

The internal clock generator may include a pull-up transistor configured to pull up the internal clock signal to a voltage level of the second power supply voltage in response to an external clock signal; a first level shifter configured to convert a voltage level of the internal clock signal from the voltage level of the second power supply voltage to the voltage level of the first power supply voltage; the self timing pulse circuit configured to, receive the first power supply voltage through the first power supply line, receive the second power supply voltage through the second power supply line, generate a first self timing pulse by delaying the internal clock signal having the voltage level of the first power supply voltage that is received from the first level shifter, and generate a second self timing pulse by delaying the internal clock signal having the voltage level of the second power supply voltage that is received from the pull-up transistor; a second level shifter configured to convert a voltage level of the first self timing pulse from the voltage level of the first power supply voltage to the voltage level of the second power supply voltage; a switch configured to, receive the first self timing pulse from the second level shifter, receive the second self pulse timing pulse from the self timing pulse circuit, output the second self timing pulse when the pulse control signal has a first logic level, and output the first self timing pulse when the pulse control signal indicates a second logic level; and a pull-down transistor configured to pull down the internal clock signal to a voltage level of a ground voltage in response to one of the first and second self timing pulses that is received from the switch.

The internal clock generator may be configured to compare the voltage level of the first power supply voltage with a voltage level of the second power supply voltage, and configured to selectively adjust the pulse width of the internal clock signal according to a result of the comparison such that the internal clock generator generates the internal clock signal based on the second power supply voltage when the voltage level of the first power supply voltage is higher than the voltage level of the second power supply voltage, and the internal clock generator adjusts the pulse width of the internal clock signal according to the voltage level of the first power supply voltage when the voltage level of the first power supply voltage is lower than the voltage level of the second power supply voltage.

The internal clock generator may include a pull-up transistor configured to pull up the internal clock signal to a voltage level of the second power supply voltage in response to an external clock signal; a first level shifter configured to convert a voltage level of the internal clock signal from the voltage level of the second power supply voltage to the voltage level of the first power supply voltage; the self timing pulse circuit configured to, receive the first power supply voltage through the first power supply line, receive the second power supply voltage through the second power supply line, generate a first self timing pulse by delaying the internal clock signal having the voltage level of the first power supply voltage that is received from the first level shifter, and generate a second self timing pulse by delaying the internal clock signal having the voltage level of the second power supply voltage that is received from the pull-up transistor; a second level shifter configured to convert a voltage level of the first self timing pulse from the voltage level of the first power supply voltage to the voltage level of the second power supply voltage; a comparator configured to compare the voltage level of the first power supply voltage with the voltage level of the second power supply voltage; a switch configured to, receive the first self timing pulse from the second level shifter, receive the second self pulse timing pulse from the self timing pulse circuit, output the second self timing pulse when an output signal of the comparator indicates that the voltage level of the first power supply voltage is higher than the voltage level of the second power supply voltage, and output the first self timing pulse when the output signal of the comparator indicates that the voltage level of the first power supply voltage is lower than the voltage level of the second power supply voltage; and a pull-down transistor configured to pull down the internal clock signal to a voltage level of a ground voltage in response to one of the first and second self timing pulses that is received from the switch.

According to one or more example embodiments, a system-on-chip may include a volatile memory device including a memory cell array configured to store data, and a peripheral circuit configured to control the memory cell array; a processing block configured to provide the data to the volatile memory device before the data is stored in the memory cell array, and configured to receive the data stored in the memory cell array from the volatile memory device; a first power management unit configured to supply a first power supply voltage to the memory cell array of the volatile memory device through a first power supply line; and a second power management unit configured to supply a second power supply voltage to the processing block and the peripheral circuit of the volatile memory device through a second power supply line, wherein the peripheral circuit includes a self timing pulse circuit configured to determine an operation timing of the peripheral circuit, wherein the first power management unit is configured to supply the first power supply voltage to the self timing pulse circuit through the first power supply line, and wherein the self timing pulse circuit is configured to adjust the operation timing of the peripheral circuit according to a voltage level of the first power supply voltage.

The peripheral circuit may include an internal clock generator, the internal clock generator includes the self timing pulse circuit, and the internal clock generator is configured to generate an internal clock signal having a pulse width that is adjusted according to the voltage level of the first power supply voltage.

According to one or more example embodiments, a volatile memory device configured to receive a first power supply voltage and a second power supply voltage may include a memory cell array configured to receive the first power supply voltage through a first power supply line, and configured to store data based on the first power supply voltage; and a peripheral circuit configured to receive a second power supply voltage through a second power supply line, and configured to control the memory cell array based on the second power supply voltage, the peripheral circuit including an internal clock generator configured to generate an internal clock signal such that a pulse width of the internal clock signal is based on a voltage level of the first power supply voltage.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
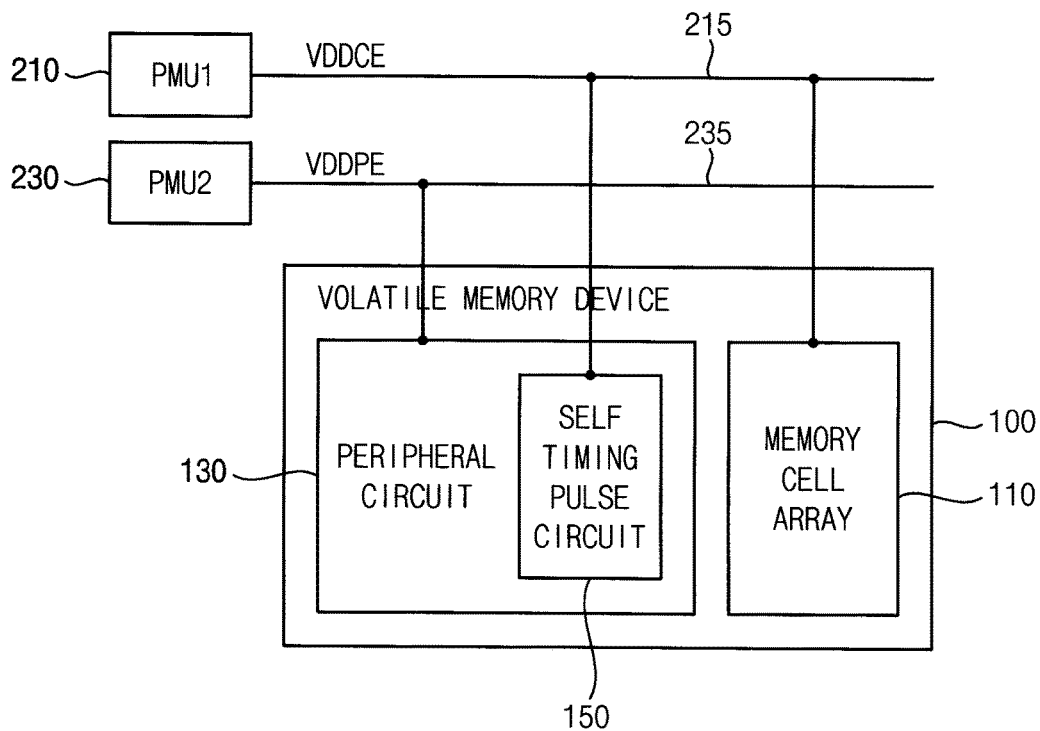
FIG. 1 is a block diagram illustrating a volatile memory device according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail.

It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
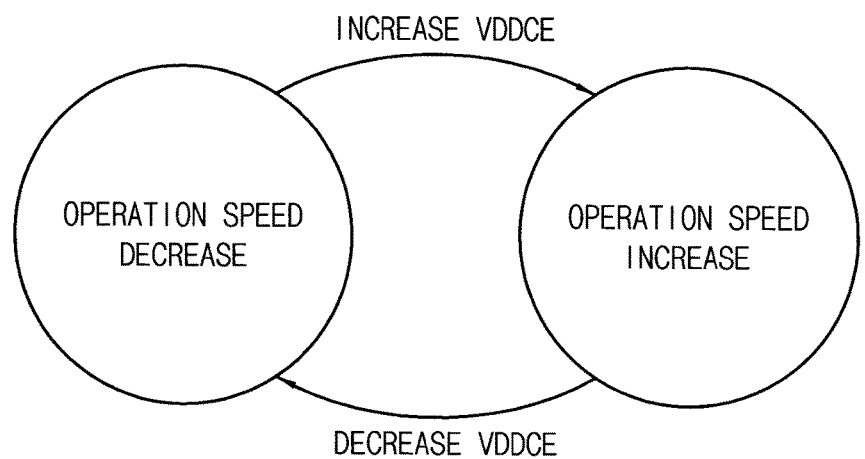
FIG. 2 is a diagram for describing an operation of a volatile memory device according to at least some example embodiments of the inventive concepts.

FIG. 1 is a block diagram illustrating a volatile memory device according to at least some example embodiments of the inventive concepts, and FIG. 2 is a diagram for describing an operation of a volatile memory device according to at least some example embodiments of the inventive concepts.

Referring to FIG. 1, a volatile memory device 100 includes a memory cell array 110 that stores data, and a peripheral circuit 130 that controls the memory cell array 110.

The memory cell array 110 and the peripheral circuit 130 may be supplied with different power supply voltages VDDCE and VDDPE. For example, the memory cell array 110 may be supplied with a first power supply voltage VDDCE through a first power supply line 215 from a first power management unit 210, and the peripheral circuit 130 may be supplied with a second power supply voltage VDDPE through a second power supply line 235 from a second power management unit 230. The memory cell array 110 may store, retain or change the data based on the first power supply voltage VDDCE supplied to the memory cell array 110, and the peripheral circuit 130 may perform an operation of the volatile memory device 100 (e.g., a write operation and a read operation for the memory cell array 110) based on the second power supply voltage VDDPE supplied to the peripheral circuit 130.

Due to a desire to reduce power consumption of the volatile memory device 100 or power consumption of an electronic device including the volatile memory device 100, a voltage level of a power supply voltage provided to the volatile memory device 100 has been decreased. However, since a distribution of characteristics of memory cells has widened as the semiconductor manufacturing process has been continuously developed, operation stability of the memory cells may not be ensured at the decreased power supply voltage. In some example embodiments, while the power consumption may be reduced by supplying the peripheral circuit 130 with the relatively low power supply voltage VDDPE, the operation stability of the memory cell array 110 may be achieved by supplying the memory cell array 110 with the relatively high power supply voltage VDDCE. This technique that supplies the different power supply voltages VDDCE and VDDPE to the memory cell array 110 and the peripheral circuit 130 may be referred to as a "dual power rail" technique.

However, even in a volatile memory device having the dual power rail structure, the operation stability of the volatile memory device may not be ensured due to dynamic changes of the power supply voltages VDDCE and VDDPE. For example, in a case where a dynamic voltage and frequency scaling (DVFS) technique that dynamically changes the power supply voltage during operation is applied to a system-on-chip (SoC) including the volatile memory device 100, the first and second power management units 210 and 230 may determine to supply the memory cell array 110 and the peripheral circuit 130 with the power supply voltages VDDCE and VDDPE having the same voltage level. However, in this case, since the first and second power management units 210 and 230 have tolerances for the power supply voltages VDDCE and VDDPE, the power supply voltages VDDCE and VDDPE provided to the memory cell array 110 and the peripheral circuit 130 may have different voltage levels even though the first and second power management units 210 and 230 determine to provide the power supply voltages VDDCE and VDDPE having the same voltage level. Further, since the first and second power supply lines 215 and 235 may have different resistances, and the memory cell array 110 and the peripheral circuit 130 may have different current consumptions or leakage currents, the power supply voltages VDDCE and VDDPE may drop (e.g., IR-drop) by different amounts. Accordingly, the power supply voltages VDDCE and VDDPE provided to the memory cell array 110 and the peripheral circuit 130 may have different voltage levels. In particular, when the first power supply voltage VDDCE provided to the memory cell array 110 is lower than the second power supply voltage VDDPE provided to the peripheral circuit 130, an operation speed of the peripheral circuit 130 may be faster than that of the memory cell array 110, and thus a write margin and/or a read margin for the memory cell array 110 may not be sufficiently obtained. Accordingly, the operation stability (e.g., write stability, read stability, etc.) of the volatile memory device 100 may not be ensured.

To obviate this problem, in the volatile memory device 100 according to at least some example embodiments of the inventive concepts, a self timing pulse (STP) circuit 150 that determines an operation timing (or the operation speed) of the peripheral circuit 130 may be supplied with the first power supply voltage VDDCE from the first power management unit 210 through the first power supply line 215. Accordingly, the self timing pulse circuit 150 may adjust the operation timing (or the operation speed) of the peripheral circuit 130 according to the voltage level of the first power supply voltage VDDCE provided to the memory cell array 110. For example, as illustrated in FIG. 2, the self timing pulse circuit 150 may advance the operation timing (or increase the operation speed) of the peripheral circuit 130 as the voltage level of the first power supply voltage VDDCE increases, and may delay the operation timing (or decrease the operation speed) of the peripheral circuit 130 as the voltage level of the first power supply voltage VDDCE decreases.

Thus, when the operation characteristic of the memory cell array 100 is deteriorated because the first power supply voltage VDDCE having a relatively low voltage level is supplied to the memory cell array 100, the self timing pulse circuit 150 may delay the operation timing (or decrease the operation speed) of the peripheral circuit 130, thereby obtaining the operation margin and the operation stability of the volatile memory device 100. Further, when the operation characteristic of the memory cell array 100 is improved because the first power supply voltage VDDCE having a relatively high voltage level is supplied to the memory cell array 100, the self timing pulse circuit 150 may advance the operation timing (or increase the operation speed) of the peripheral circuit 130, thereby improving the operation performance of the volatile memory device 100. In other words, the self timing pulse circuit 150 may track the operation performance of the memory cell array 110, thereby obtaining the operation stability (e.g., write stability, read stability, etc.) of the volatile memory device 100 while maintaining or improving the operation performance of the volatile memory device 100.

In some example embodiments, as the voltage level of the first power supply voltage VDDCE decreases, the self timing pulse circuit 150 may delay a start timing of a sensing operation for reading data stored in the memory cell array 110. For example, when a word line driving voltage is applied to a selected word line to perform a read operation for the memory cell array 110, a dummy word line may also be selected, and a voltage difference may occur between a pair of dummy bit lines. The self timing pulse circuit 150 may sense the voltage difference between the pair of dummy bit lines, and may generate a sense enable signal to initiate a sensing operation for reading data from memory cells coupled to the selected word line. In some example embodiments, since the self timing pulse circuit 150 is supplied with the first power supply voltage VDDCE, the self timing pulse circuit 150 may generate the sense enable signal at the timing suitable for the operation characteristic of the memory cell array 110 supplied with the first power supply voltage VDDCE. For example, as the voltage level of the first power supply voltage VDDCE decreases, the self timing pulse circuit 150 may delay the generation of the sense enable signal to delay the start timing of the sensing operation. Accordingly, even if the first power supply voltage VDDCE is lower than the second power supply voltage VDDPE, the operation stability (or the read stability) of the volatile memory device 100 may be achieved. Further, as the voltage level of the first power supply voltage VDDCE increases, the self timing pulse circuit 150 may advance the generation of the sense enable signal to advance the start timing of the sensing operation, thereby improving the operation performance of the volatile memory device 100.

In other example embodiments, as the voltage level of the first power supply voltage VDDCE decreases, the self timing pulse circuit 150 may delay an end timing of a write operation for writing data into the memory cell array 110. The self timing pulse circuit 150 may be included in an internal clock generator of the volatile memory device 100, and the internal clock generator including the self timing pulse circuit 150 supplied with the first power supply voltage VDDCE may generate an internal clock signal having a pulse width that is adjusted according to the voltage level of the first power supply voltage VDDCE. For example, the internal clock generator may decrease the pulse width of the internal clock signal as the voltage level of the first power supply voltage VDDCE increases, and may increase the pulse width of the internal clock signal as the voltage level of the first power supply voltage VDDCE decreases. As described above, when the voltage level of the first power supply voltage VDDCE decreases, the internal clock signal may generate the internal clock signal having the increased pulse width, and the peripheral circuit 130 may increase a pulse width of a word line driving voltage based on the internal clock signal having the increased pulse width to delay the end timing of application of the word line driving voltage. That is, as the voltage level of the first power supply voltage VDDCE decreases, the self timing pulse circuit 150 may increase the pulse width of the internal clock signal, and thus the end timing of application of the word line driving voltage may be delayed (or an application time of the word line driving voltage may be increased), which results in the delay of the end timing of the write operation. Accordingly, even if the first power supply voltage VDDCE is lower than the second power supply voltage VDDPE, the operation stability (or the write stability) of the volatile memory device 100 may be achieved. Further, as the voltage level of the first power supply voltage VDDCE increases, the self timing pulse circuit 150 may advance the end timing of the write operation for writing the data into the memory cell array 110, thereby improving the operation performance of the volatile memory device 100.

As described above, in the volatile memory device 100 having the dual power rail structure where the memory cell array 110 and the peripheral circuit 130 are supplied with different power supply voltages VDDCE and VDDPE, the self timing pulse circuit 150 may be supplied with the power supply voltage VDDCE that is supplied to the memory cell array 110, and thus the self timing pulse circuit 150 may adjust the operation timing (or the operation speed) of the peripheral circuit 130 according to the voltage level of the power supply voltage VDDCE supplied to the memory cell array 110. That is, in the volatile memory device 100 according to at least some example embodiments of the inventive concepts, the self timing pulse circuit 150 may adjust the operation timing (or the operation speed) of the peripheral circuit 130 by tracking the operation characteristic of the memory cell array 110, thereby achieving the operation stability of the volatile memory device 100 while maintaining or improving the operation performance of the volatile memory device 100.

Figure 3:
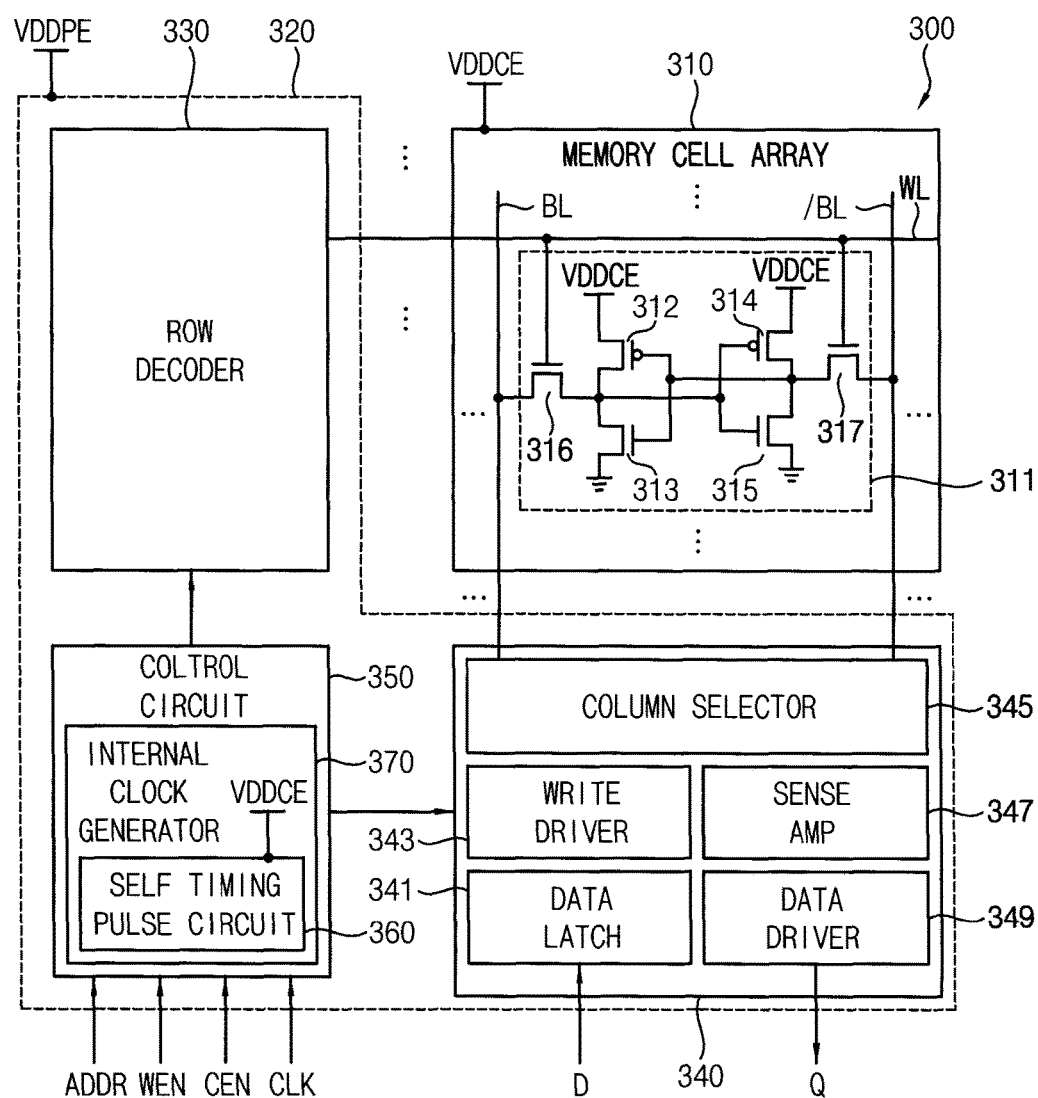
FIG. 3 is a block diagram illustrating an example of a volatile memory device according to at least some example embodiments of the inventive concepts.
Figure 4:
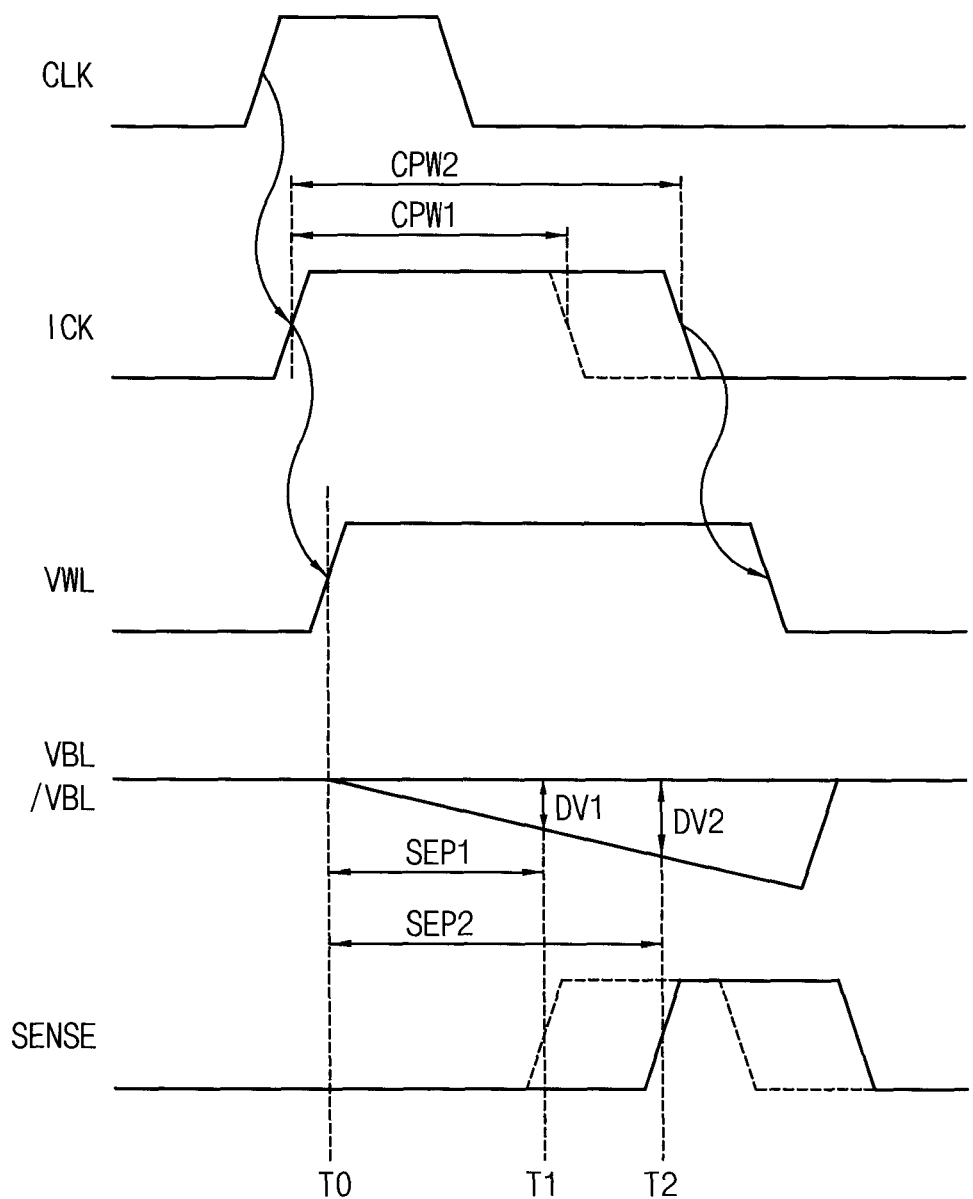
FIG. 4 is a timing diagram for describing an example of a read operation of a volatile memory device of FIG. 3.
Figure 5:
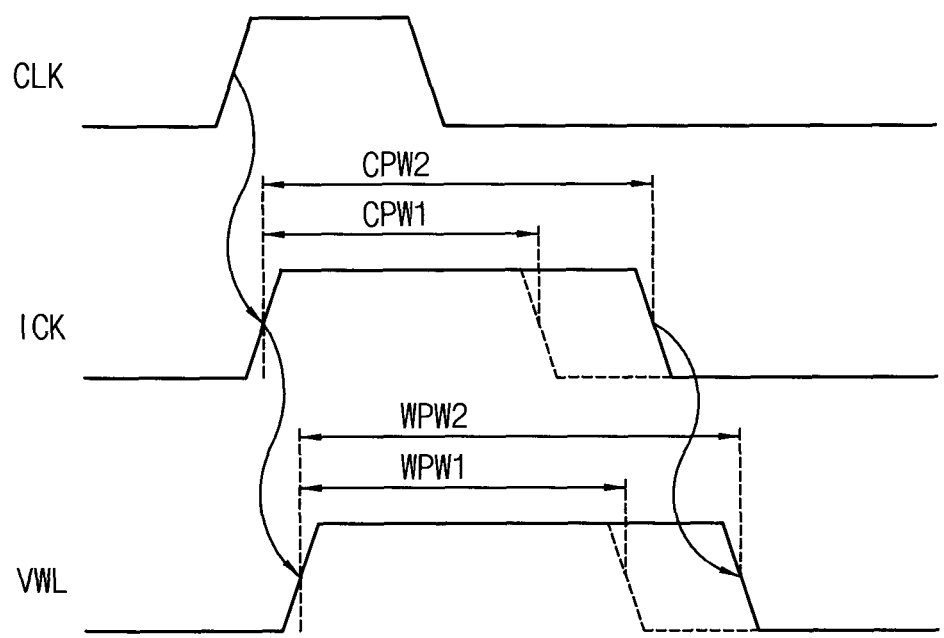
FIG. 5 is a timing diagram for describing an example of a write operation of a volatile memory device of FIG. 3.

FIG. 3 is a block diagram illustrating an example of a volatile memory device according to at least some example embodiments of the inventive concepts, FIG. 4 is a timing diagram for describing an example of a read operation of a volatile memory device of FIG. 3, and FIG. 5 is a timing diagram for describing an example of a write operation of a volatile memory device of FIG. 3.

Referring to FIG. 3, a volatile memory device 300 includes a memory cell array 310 that stores data, and a peripheral circuit 320 that controls the memory cell array 310. The memory cell array 310 and the peripheral circuit 320 may be supplied with different first and second power supply voltages VDDCE and VDDPE.

The memory cell array 310 may include a plurality of memory cells 311 that are arranged in a matrix having a plurality of rows and a plurality of columns. In some example embodiments, the volatile memory device 300 may be a static random access memory (SRAM) device, and the memory cells 311 may be SRAM cells. For example, each memory cell 311 may have a structure including six transistors 312, 313, 314, 315, 316 and 317.

Each memory cell 311 may include a first inverter 312 and 313, a second inverter 314 and 315, a first access transistor 316 and a second access transistor 317. The first inverter 312 and 313 may include a PMOS transistor 312 having a source coupled to the first power supply voltage VDDCE, a drain coupled to an input terminal of the second inverter 314 and 315 and a gate coupled to an output terminal of the second inverter 314 and 315, and an NMOS transistor 313 having a source coupled to a ground voltage, a drain coupled to the input terminal of the second inverter 314 and 315 and a gate coupled to the output terminal of the second inverter 314 and 315. The second inverter 314 and 315 may include a PMOS transistor 314 having a source coupled to the first power supply voltage VDDCE, a drain coupled to an input terminal of the first inverter 312 and 313 and a gate coupled to an output terminal of the first inverter 312 and 313, and an NMOS transistor 315 having a source coupled to the ground voltage, a drain coupled to the input terminal of the first inverter 312 and 313 and a gate coupled to the output terminal of the first inverter 312 and 313. The first access transistor 316 may be an NMOS transistor 316 having a first source or drain coupled to a first bit line BL, a second source or drain coupled to the input terminal of the second inverter 314 and 315 and a gate coupled to a word line WL, and the second access transistor 317 may be an NMOS transistor 317 having a first source or drain coupled to a second bit line /BL, a second source or drain coupled to the input terminal of the first inverter 312 and 313 and a gate coupled to the word line WL.

Data output from the first inverter 312 and 313 may be input to the second inverter 314 and 315, and the second inverter 314 and 315 may output inverted data by inverting the data from the first inverter 312 and 313. The inverted data output from the second inverter 314 and 315 may be input to the first inverter 312 and 313, and the first inverter 312 and 313 may output the data by inverting the inverted data from the second inverter 314 and 315. Accordingly, the memory cell 311 may retain the data while the memory cell 311 is supplied with the first power supply voltage VDDCE.

The peripheral circuit 320 may include a row decoder 330, a data write/read unit 340 and a control circuit 350. The row decoder 330 may be controlled by the control circuit 350 to apply a word line driving voltage to a selected word line WL. The data write/read unit 340 may be controlled by the control circuit 350 to write data D provided from an external circuit, block or device into the memory cell 311 coupled to the selected word line WL and at least one selected pair of bit lines BL and /BL, or to read data Q from the memory cell 311 to provide the data Q to the external circuit, block or device. For example, the data write/read unit 340 may be implemented as a circuit that includes the following circuits: a data latch 341 that receives the data D from the external circuit, block or device, a write driver 343 that writes the data D received by the data latch 341 into the memory cell 311, a column selector 345 that selects at least one pair of bit lines BL and /BL, a sense amplifier 347 that senses the data Q stored in the memory cell 311, and a data driver 349 that outputs the data Q sensed by the sense amplifier 345 to the external circuit, block or device.

The control circuit 350 may control an operation of the volatile memory device 300 by receiving an address signal ADDR and a control signal WEN, CEN and CLK from the external circuit, block or device. For example the control signal WEN, CEN and CLK may include a write enable signal WEN, a chip enable signal CEN and a clock signal CLK.

The control circuit 350 may include self timing pulse circuit 360 that determines an operation timing of the peripheral circuit 320. The self timing pulse circuit 360 may be supplied with the first power supply voltage VDDCE that is supplied to the memory cell array 310, and may operate based on the first power supply voltage VDDCE. Thus, the self timing pulse circuit 360 may adjust the operation timing of the peripheral circuit 320 according to a voltage level of the first power supply voltage VDDCE. That is, the self timing pulse circuit 360 may adjust the operation timing (or an operation speed) of the peripheral circuit 320 by tracking an operation characteristic of the memory cell array 310, thereby improving operation stability of the volatile memory device 300 while maintaining or improving operation performance of the volatile memory device 300.

In some example embodiments, the self timing pulse circuit 360 may be included in an internal clock generator 370, and the internal clock generator 370 may be a circuit that adjusts a pulse width of an internal clock signal based on a self timing pulse generated by the self timing pulse circuit 360 supplied with the first power supply voltage VDDCE. That is, the internal clock generator 370 may adjust the pulse width of the internal clock signal according to the voltage level of the first power supply voltage VDDCE by using the self timing pulse circuit 360 supplied with the first power supply voltage VDDCE. Accordingly, since the control circuit 350 and the peripheral circuit 320 operate in response to the internal clock signal having the pulse width that is adjusted according to the voltage level of the first power supply voltage VDDCE, the operation stability of the volatile memory device 300 may be improved, and the operation performance of the volatile memory device 300 may be maintained or improved.

The self timing pulse circuit 360 and the internal clock generator 370 may delay a start timing of a sensing operation for reading data stored in the memory cell array 310 or may increase the pulse width of the internal clock signal as the voltage level of the first power supply voltage VDDCE decreases. For example, as illustrated in FIG. 4, the internal clock generator 370 may generate a rising edge of the internal clock signal ICK in response to a rising edge of the external clock signal CLK, and may generate a falling edge of the internal clock signal ICK in response to the self timing pulse of the self timing pulse circuit 360. Thus, a timing of the falling edge of the internal clock signal ICK may be adjusted by the self timing pulse circuit 360 supplied with the first power supply voltage VDDCE, and thus the pulse width of the internal clock signal ICK may be increased from a first pulse width CPW1 to a second pulse width CPW2 when the voltage level of the power supply voltage VDDCE decreases.

When a read operation is performed, a word line driving voltage VWL may be applied to a selected word line WL in response to the rising edge of the internal clock signal ICK, and voltages VBL and /VBL corresponding to data stored in the memory cell 311 may be applied (or a differential voltage may be developed) to a selected pair of bit lines BL and /BL. In a typical volatile memory device, when a voltage level of a power supply voltage VDDCE supplied to a memory cell array decreases, a voltage difference at the selected pair of the bit lines may be reduced, and thus erroneous data may be sensed. That is, at a first time point Ti that is a start timing of a sensing operation of a typical volatile memory device, the selected pair of bit lines BL and /BL may have a voltage difference DV1 that is insufficient for accurate sensing operation. However, in the volatile memory device 300 according to at least some example embodiments of the inventive concepts, since the self timing pulse circuit 360 is supplied with the first power supply voltage VDDCE that is supplied to the memory cell array 310, the self timing pulse circuit 360 may delay the start timing of the sensing operation by delaying a timing of generation of a sense enable signal SENSE that initiates the sensing operation when the voltage level of the first power supply voltage VDDCE decreases. Accordingly, even if the voltage level of the first power supply voltage VDDCE decreases, the selected pair of bit lines BL and /BL may have a sufficient voltage difference DV2 at the start timing T2 of the sensing operation in the volatile memory device 300 according to at least some example embodiments of the inventive concepts. That is, a time period SEP1 from a timing T0 of application of the word line driving voltage VWL to a timing T1 of generation of the sense enable signal SENSE by the typical volatile memory device may be increased by the self timing pulse circuit 360 to a time period SEP2 from the timing T0 of the application of the word line driving voltage VWL to the timing T2 of delayed generation of the sense enable signal SENSE, and thus the sufficient voltage difference DV2 may be developed at the selected pair of bit lines BL and /BL at the start timing of the sensing operation. Accordingly, the operation stability (or the read stability) of the volatile memory device 300 may be improved.

Further, the self timing pulse circuit 360 and the internal clock generator 370 may delay an end timing of a write operation for writing data into the memory cell array 310 as the voltage level of the first power supply voltage VDDCE decreases. For example, as illustrated in FIG. 5, when the voltage level of the first power supply voltage VDDCE decreases, the internal clock generator 370 may increase the pulse width of the internal clock signal ICK from a first pulse width CPW1 to a second pulse width CPW2 by using the self timing pulse circuit 360 supplied with the first power supply voltage VDDCE. In this case, when performing a write operation, since the pulse width of the internal clock signal ICK is increased, or the falling edge of the internal clock signal ICK is delayed, the pulse width of the word line driving voltage VWL that is applied in response to the internal clock signal ICK may be increased from a first pulse width WPW1 to a second pulse width WPW2. Thus, as the voltage level of the first power supply voltage VDDCE supplied to the memory cell array 310 decreases, the pulse width of the word line driving voltage VWL is increased, and a write time for the memory cell 311 may be increased. Accordingly, operation stability (or the write stability) of the volatile memory device 300 may be improved.

As described above, in the volatile memory device 300 having the dual power rail structure where the memory cell array 310 and the peripheral circuit 320 are supplied with different power supply voltages VDDCE and VDDPE, the self timing pulse circuit 350 may be supplied with the power supply voltage VDDCE that is supplied to the memory cell array 310, and thus the self timing pulse circuit 350 may adjust the pulse width of the internal clock signal ICK and the operation timing (or the operation speed) of the peripheral circuit 320 according to the voltage level of the power supply voltage VDDCE supplied to the memory cell array 310. Accordingly, the operation stability of the volatile memory device 300 may be achieved while maintaining or improving the operation performance of the volatile memory device 300.

Figure 6:
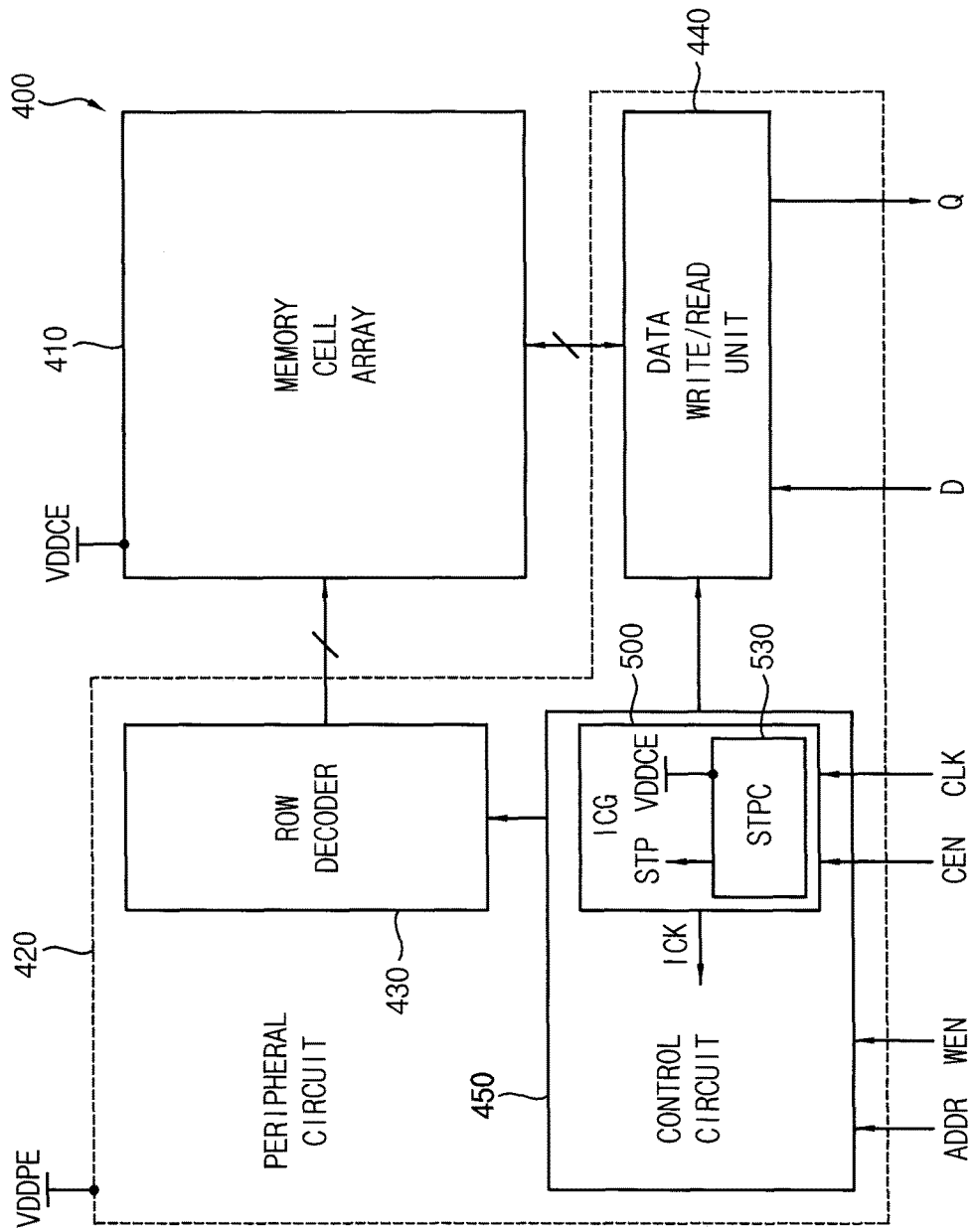
FIG. 6 is a block diagram illustrating a volatile memory device according to at least some example embodiments of the inventive concepts.
Figure 7:
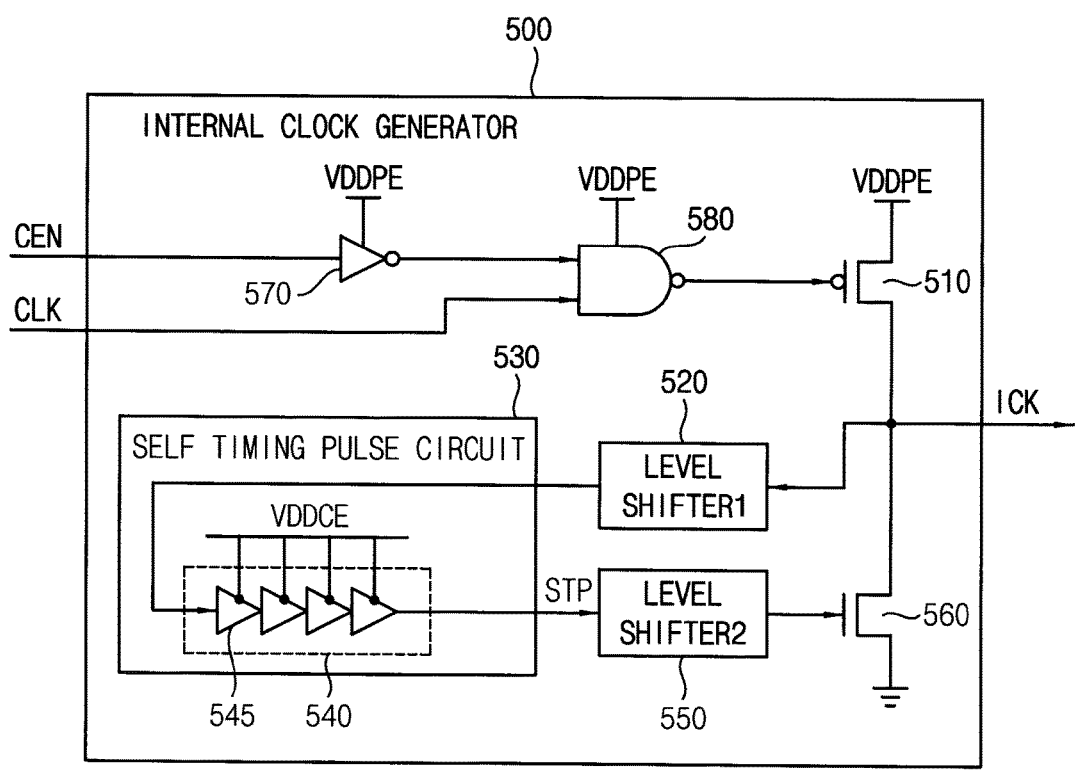
FIG. 7 is a block diagram illustrating an example of an internal clock generator included in a volatile memory device of FIG. 6.

FIG. 6 is a block diagram illustrating a volatile memory device according to at least some example embodiments of the inventive concepts, and FIG. 7 is a block diagram illustrating an example of an internal clock generator included in a volatile memory device of FIG. 6.

Referring to FIGS. 6 and 7, a volatile memory device 400 includes a memory cell array 410 that stores data, and a peripheral circuit 420 that controls the memory cell array 410. The memory cell array 410 and the peripheral circuit 420 may be supplied with different first and second power supply voltages VDDCE and VDDPE.

The peripheral circuit 420 may include the following circuits: a row decoder 430, a data write/read unit 440 and a control circuit 450. The row decoder 430 may apply a word line driving voltage to a selected word line WL. The data write/read unit 440 may write data D provided from an external circuit, block or device into the memory cell array 410, or may read data Q from the memory cell array 410 to provide the data Q to the external circuit, block or device. The control circuit 450 may control an operation of the volatile memory device 400.

The control circuit 450 may include an internal clock generator 500 that generates an internal clock signal ICK. The internal clock generator 500 may generate the internal clock signal ICK based on a self timing pulse STP generated by a self timing pulse circuit 530 supplied with the first power supply voltage VDDCE that is supplied to the memory cell array 410. Thus, a pulse width of the internal clock signal ICK may be adjusted according to a voltage level of the first power supply voltage VDDCE. Accordingly, an operation timing (or an operation speed) of the peripheral circuit 420 that operates in response to the internal clock signal ICK may be adjusted according to the voltage level of the first power supply voltage VDDCE, or according to an operation characteristic of the memory cell array 410.

In some example embodiments, as illustrated in FIG. 7, the internal clock generator 500 may include a pull-up transistor 510, a first level shifter 520, a self timing pulse circuit 530, a second level shifter 550 and a pull-down transistor 560.

The pull-up transistor 510 may be supplied with the second power supply voltage VDDPE, and may pull up the internal clock signal ICK to a voltage level of the second power supply voltage VDDPE in response to an external clock signal CLK. The first level shifter 520 may convert a voltage level of the internal clock signal ICK from the voltage level of the second power supply voltage VDDPE to the voltage level of the first power supply voltage VDDCE.

The self timing pulse circuit 530 may be supplied with the first power supply voltage VDDCE that is supplied to the memory cell array 410, and may generate the self timing pulse STP by delaying the internal clock signal ICK having the voltage level of the first power supply voltage VDDCE. In some example embodiments, the self timing pulse circuit 530 may include a delay line 540 supplied with the first power supply voltage VDDCE. The delay line 540 may receive the internal clock signal ICK having the voltage level of the first power supply voltage VDDCE from the first level shifter 520, and may generate the self timing pulse STP by delaying the internal clock signal ICK having the voltage level of the first power supply voltage VDDCE. According to at least some example embodiments of the inventive concepts, the delay line 540 may include a plurality of serially connected buffers 545, inverters or other logic gates that are supplied with the first power supply voltage VDDCE.

The second level shifter 550 may convert a voltage level of the self timing pulse STP from the voltage level of the first power supply voltage VDDCE to the voltage level of the second power supply voltage VDDPE. The pull-down transistor 560 may generate a falling edge of the internal clock signal ICK by pulling down the internal clock signal ICK to a ground voltage in response to the self timing pulse STP having the voltage level of the second power supply voltage VDDPE.

In some example embodiments, the internal clock generator 500 may further include an inverter 570 that inverts a chip enable signal CEN, and a NAND gate 580 that performs a NAND operation on the inverted chip enable signal CEN and the external clock signal CLK. An output terminal of the NAND gate 580 may be coupled to a gate terminal of the pull-up transistor 510. Thus, when the chip enable signal CEN is activated (e.g., active low), or when the volatile memory device 400 is selected, the internal clock signal ICK may be generated.

As described above, since the falling edge of the internal clock signal ICK may be generated by the self timing pulse circuit 530 supplied with the first power supply voltage VDDCE, the pulse width of the internal clock signal ICK may be adjusted according to the voltage level of the first power supply voltage VDDCE. Accordingly, the operation timing (or the operation speed) of the peripheral circuit 420 may be adjusted according to the voltage level of the first power supply voltage VDDCE, thereby achieving the operation stability of the volatile memory device 400 while maintaining or improving the operation performance of the volatile memory device 400.

Figure 8:
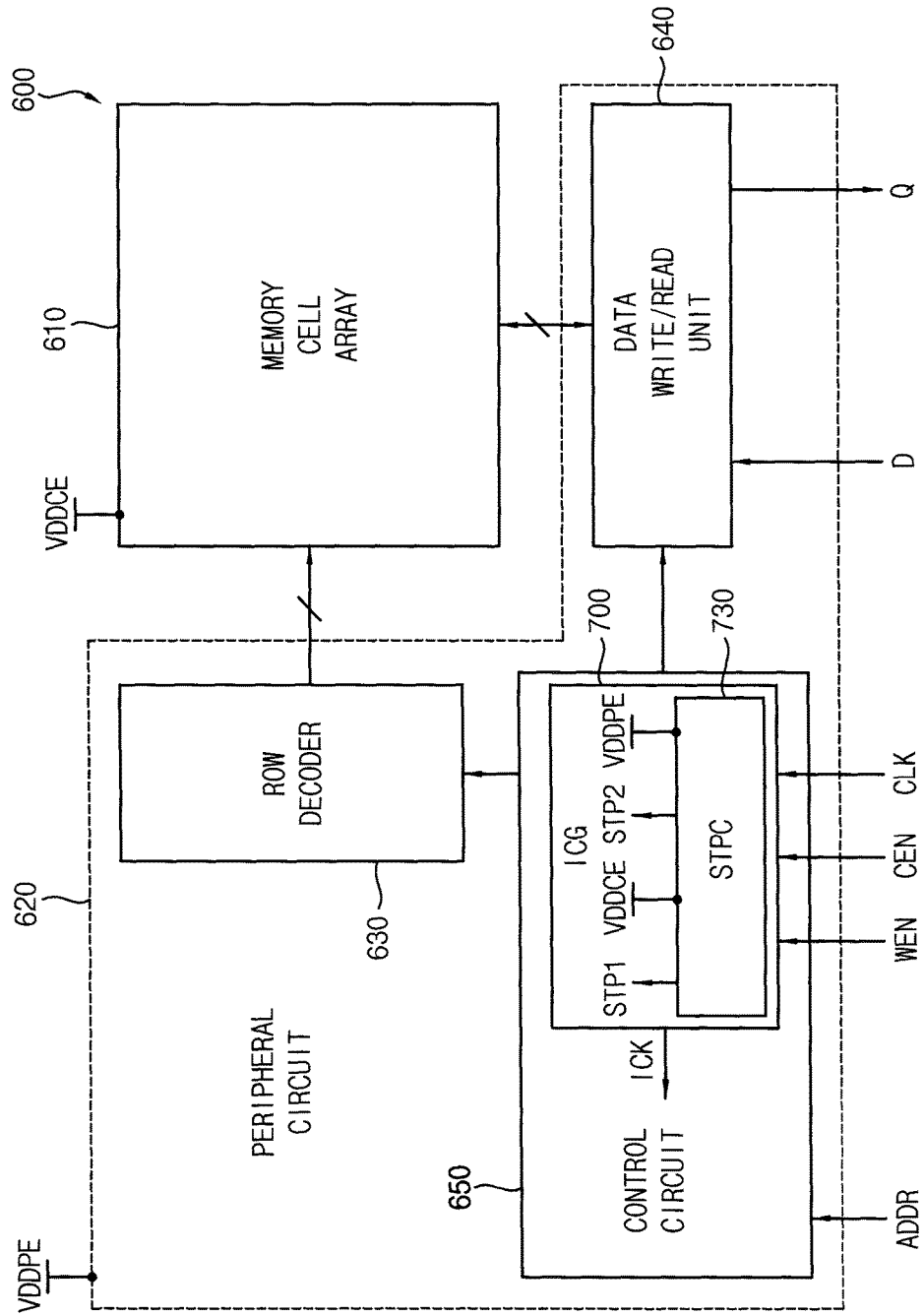
FIG. 8 is a block diagram illustrating a volatile memory device according to at least some example embodiments of the inventive concepts.
Figure 9:
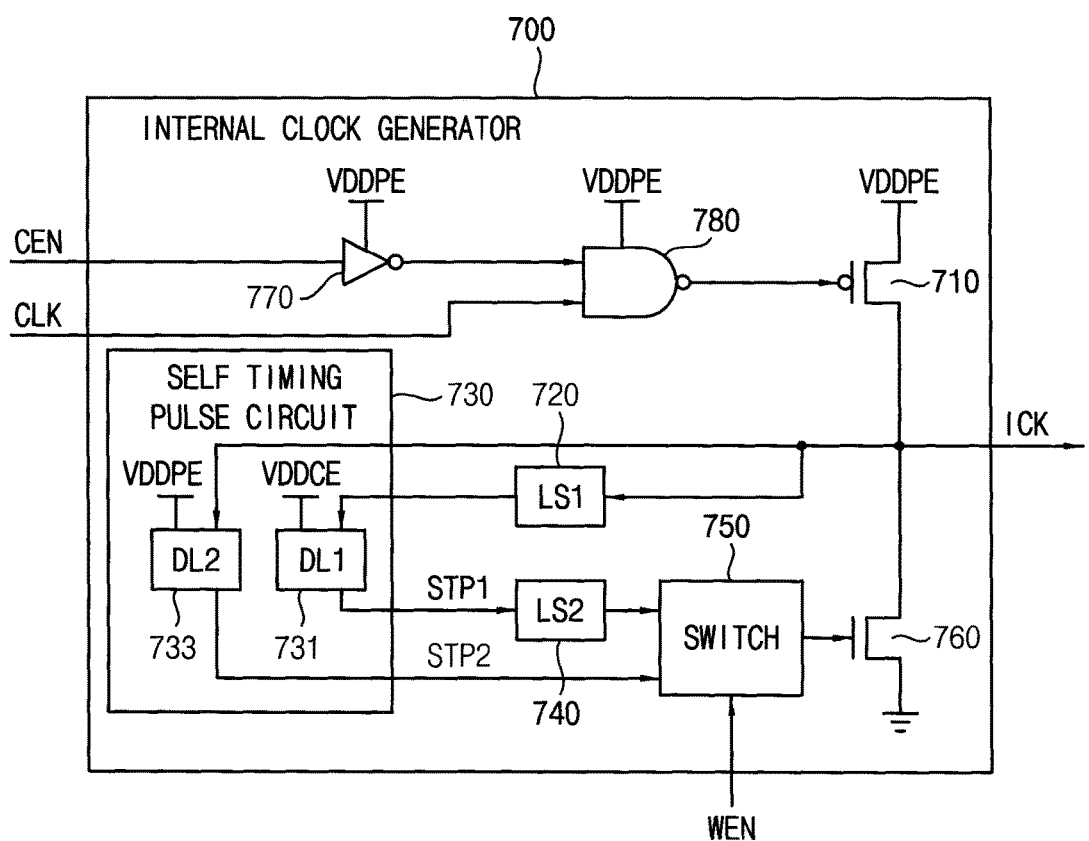
FIG. 9 is a block diagram illustrating an example of an internal clock generator included in a volatile memory device of FIG. 8.

FIG. 8 is a block diagram illustrating a volatile memory device according to at least some example embodiments of the inventive concepts, and FIG. 9 is a block diagram illustrating an example of an internal clock generator included in a volatile memory device of FIG. 8.

Referring to FIGS. 8 and 9, a volatile memory device 600 includes a memory cell array 610 that stores data, and a peripheral circuit 620 that controls the memory cell array 610. The memory cell array 610 and the peripheral circuit 620 may be supplied with different first and second power supply voltages VDDCE and VDDPE. The peripheral circuit 620 may include, for example, the following circuits: a row decoder 630, a data write/read unit 640 and a control circuit 650. The volatile memory device 600 of FIG. 8 may have a similar configuration to a volatile memory device 400 of FIG. 6, except for configurations of an internal clock generator 700 and a self timing pulse circuit 730.

The internal clock generator 700 may selectively adjust a pulse width of an internal clock signal ICK in response to a write enable signal WEN. For example, the internal clock generator 700 may generate the internal clock signal ICK based on the second power supply voltage VDDPE without adjusting the pulse width of the internal clock signal ICK when the write enable signal WEN indicates a write mode, and may adjust the pulse width of the internal clock signal ICK according to a voltage level of the first power supply voltage VDDCE when the write enable signal WEN indicates a read mode. As illustrated in FIG. 9, the internal clock generator 700 may include a pull-up transistor 710, a first level shifter 720, a self timing pulse circuit 730, a second level shifter 740, a switch 750 and a pull-down transistor 760.

The pull-up transistor 710 may pull up the internal clock signal ICK to a voltage level of the second power supply voltage VDDPE in response to an external clock signal CLK. The first level shifter 720 may convert a voltage level of the internal clock signal ICK from the voltage level of the second power supply voltage VDDPE to the voltage level of the first power supply voltage VDDCE.

The self timing pulse circuit 730 may be supplied with both of the first and second power supply voltages VDDCE and VDDPE, may generate a first self timing pulse STP1 by delaying the internal clock signal ICK having the voltage level of the first power supply voltage VDDCE received from the first level shifter 720, and may generate a second self timing pulse STP2 by delaying the internal clock signal ICK having the voltage level of the second power supply voltage VDDPE received from the pull-up transistor 710. In some example embodiments, the self timing pulse circuit 730 may include a first delay line 731 that generates the first self timing pulse STP1 and a second delay line 733 that generates the second self timing pulse STP2. The first delay line 731 may be supplied with the first power supply voltage VDDCE, may receive the internal clock signal ICK having the voltage level of the first power supply voltage VDDCE from the first level shifter 520, and may generate the first self timing pulse STP1 by delaying the internal clock signal ICK having the voltage level of the first power supply voltage VDDCE. The second delay line 733 may be supplied with the second power supply voltage VDDPE, may receive the internal clock signal ICK having the voltage level of the second power supply voltage VDDPE from the pull-up transistor 710, and may generate the second self timing pulse STP2 by delaying the internal clock signal ICK having the voltage level of the second power supply voltage VDDPE. The second level shifter 740 may convert a voltage level of the first self timing pulse STP1 from the voltage level of the first power supply voltage VDDCE to the voltage level of the second power supply voltage VDDPE.

The switch 750 may receive the first self timing pulse STP1 from the second level shifter 740, and may receive the second self timing pulse STP2 from the self timing pulse circuit 730. The switch 750 may output the second self timing pulse STP2 when the write enable signal WEN indicates the write mode, and may output the first self timing pulse STP1 when the write enable signal WEN indicates the read mode. The pull-down transistor 760 may pull down the internal clock signal ICK to a ground voltage in response to one of the first and second self timing pulses STP1 and STP2 received from the switch 750. Accordingly, the pulse width of the internal clock signal ICK may be selectively adjusted according to an operation mode represented by the write enable signal WEN.

Figure 10:
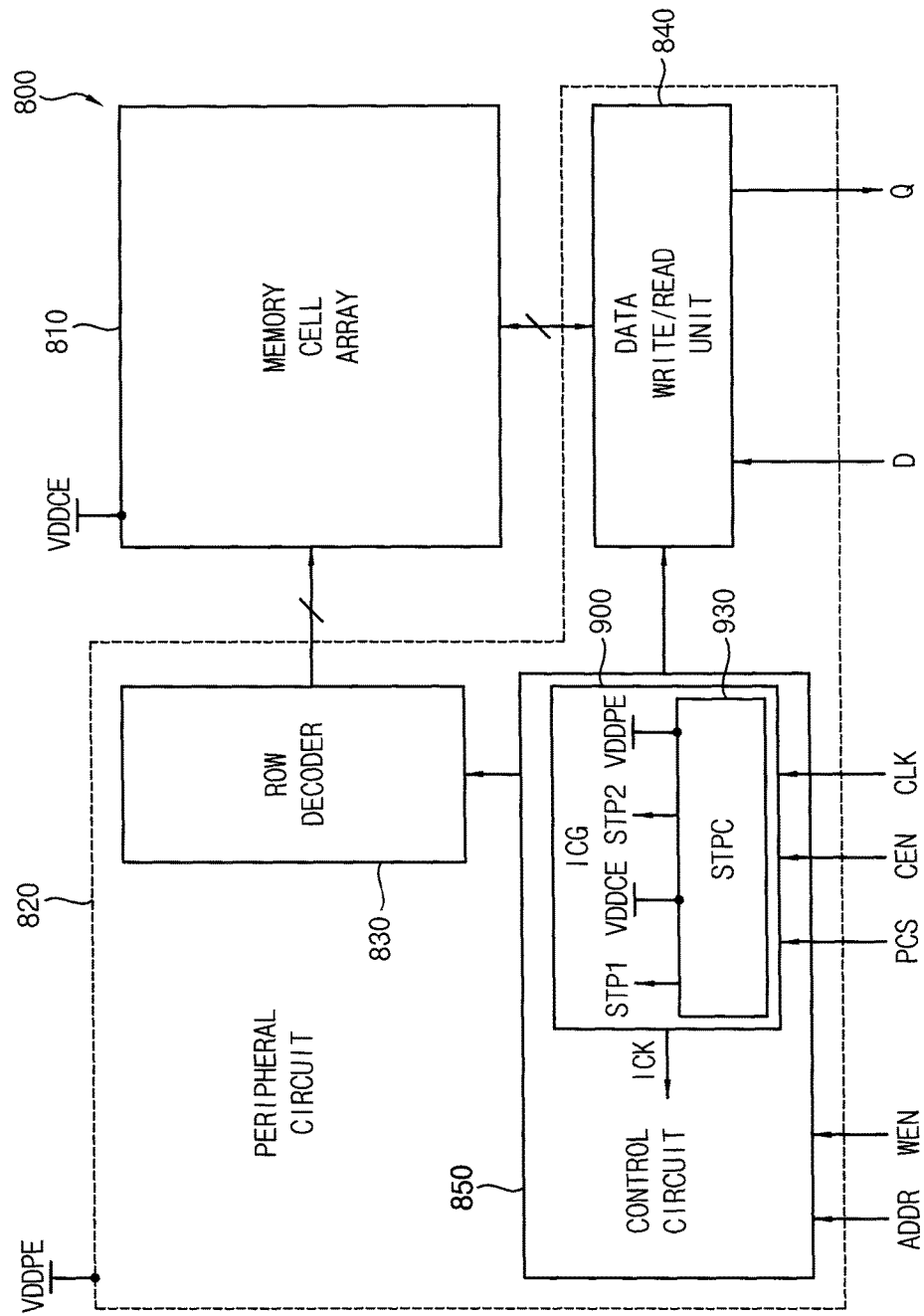
FIG. 10 is a block diagram illustrating a volatile memory device according to at least some example embodiments of the inventive concepts.
Figure 11:
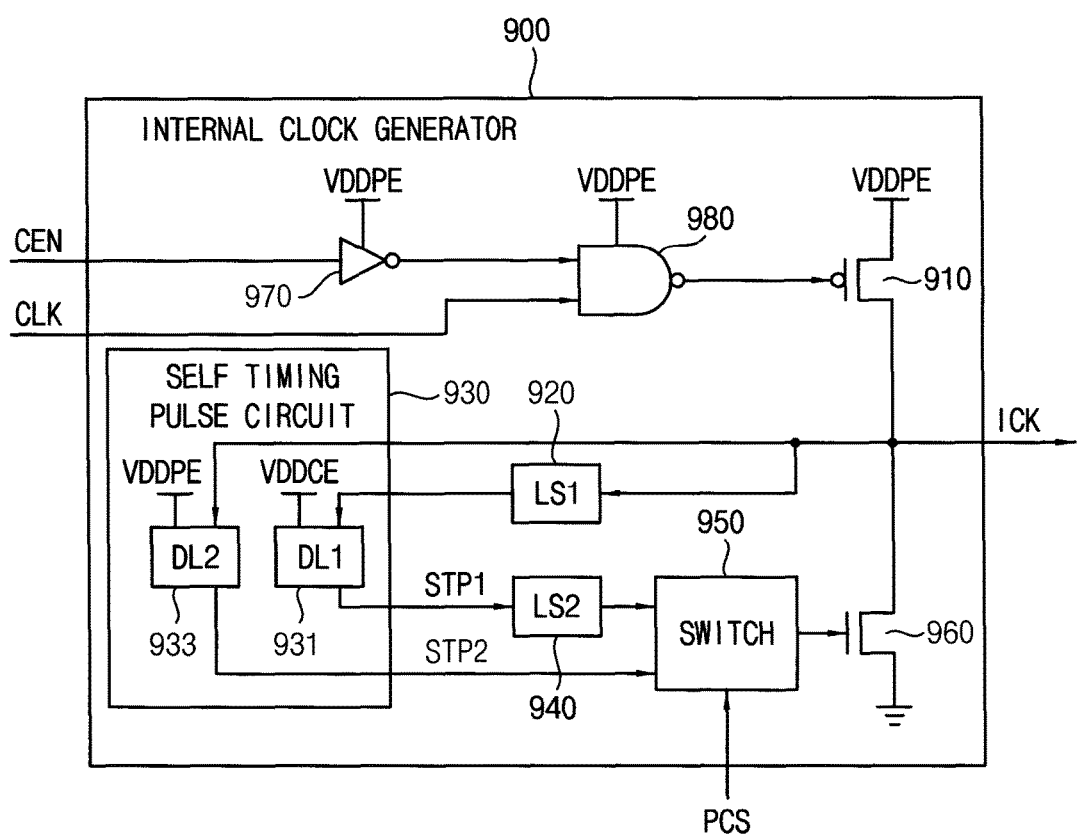
FIG. 11 is a block diagram illustrating an example of an internal clock generator included in a volatile memory device of FIG. 10.

FIG. 10 is a block diagram illustrating a volatile memory device according to at least some example embodiments of the inventive concepts, and FIG. 11 is a block diagram illustrating an example of an internal clock generator included in a volatile memory device of FIG. 10.

Referring to FIGS. 10 and 11, a volatile memory device 800 includes a memory cell array 810 that stores data, and a peripheral circuit 820 that controls the memory cell array 810. The memory cell array 810 and the peripheral circuit 820 may be supplied with different first and second power supply voltages VDDCE and VDDPE. The peripheral circuit 820 may include, for example, the following circuits: a row decoder 830, a data write/read unit 840 and a control circuit 850. The volatile memory device 800 of FIG. 10 may have a similar configuration to a volatile memory device 400 of FIG. 6, except for configurations of an internal clock generator 900 and a self timing pulse circuit 930.

The internal clock generator 900 may selectively adjust a pulse width of an internal clock signal ICK in response to a pulse control signal PCS received from an external circuit, block or device. For example, the internal clock generator 900 may generate the internal clock signal ICK based on the second power supply voltage VDDPE without adjusting the pulse width of the internal clock signal ICK when the pulse control signal PCS has a first logic level, and may adjust the pulse width of the internal clock signal ICK according to a voltage level of the first power supply voltage VDDCE when the pulse control signal PCS has a second logic level. Thus, the external circuit (e.g., an external processing block) may determine whether to adjust the pulse width of the internal clock signal ICK, or an operation timing (or an operation speed) of the peripheral circuit 820.

In some example embodiments, the internal clock generator 900 may receive the pulse control signal PCS having the first logic level when the external processing block operates in a super under drive mode, and may not adjust the pulse width of the internal clock signal ICK based on the pulse control signal PCS having the first logic level. The internal clock generator 900 may receive the pulse control signal PCS having the second logic level when the external processing block operates in another mode (e.g., an over drive mode, a normal mode or an under drive mode), and may adjust the pulse width of the internal clock signal ICK according to the voltage level of the first power supply voltage VDDCE in response to the pulse control signal PCS having the second logic level.

As illustrated in FIG. 11, the internal clock generator 900 may include a pull-up transistor 910, a first level shifter 920, a self timing pulse circuit 930, a second level shifter 940, a switch 950 and a pull-down transistor 960. In some example embodiments, the internal clock generator 900 may further include an inverter 970 and a NAND gate 980. The internal clock generator 900 of FIG. 11 may have a similar configuration and a similar operation to an internal clock generator 900 of FIG. 9, except that one of first and second self timing pulses STP1 and SPT2 is selected in response to the pulse control signal PCS.

Figure 12:
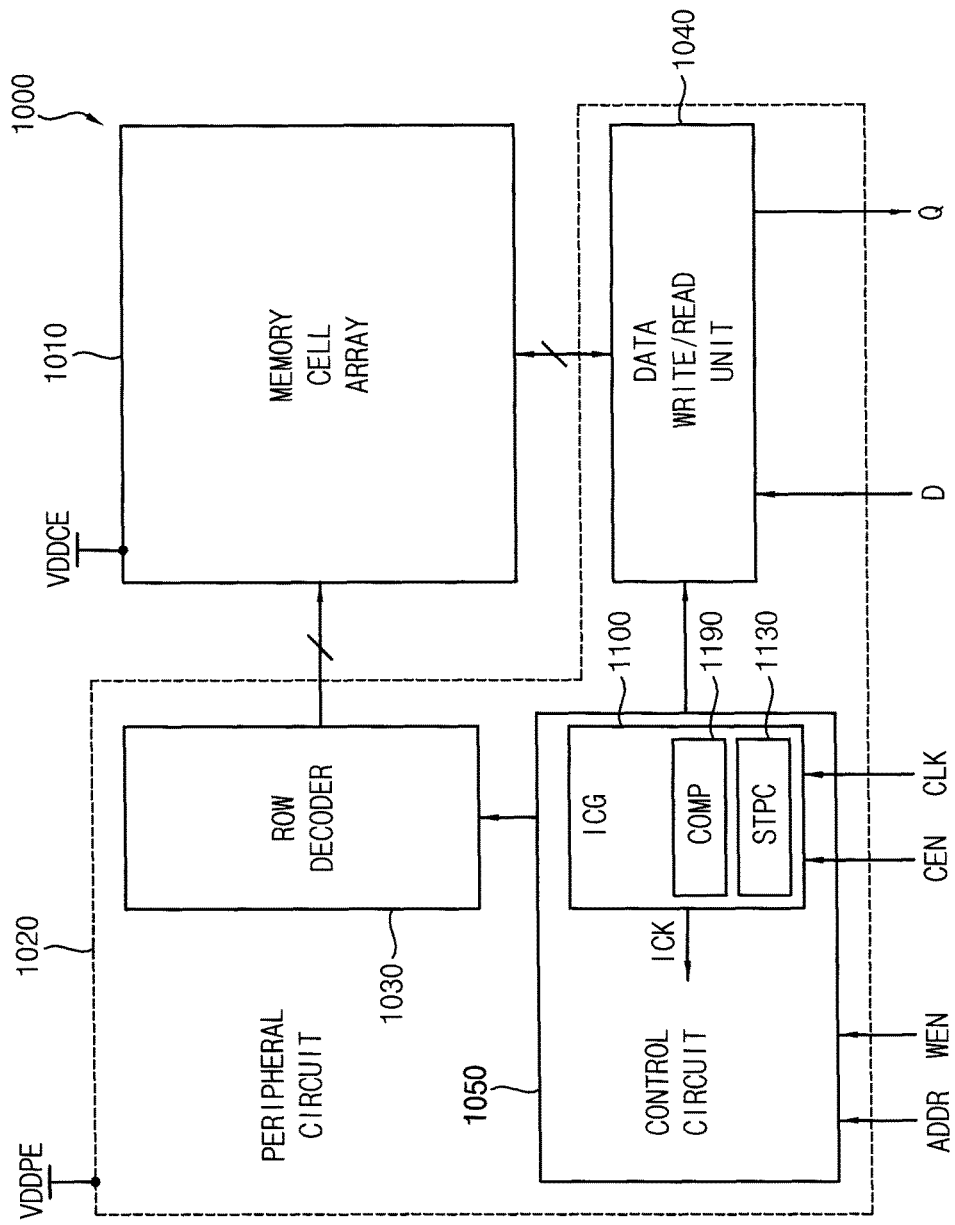
FIG. 12 is a block diagram illustrating a volatile memory device according to at least some example embodiments of the inventive concepts.
Figure 13:
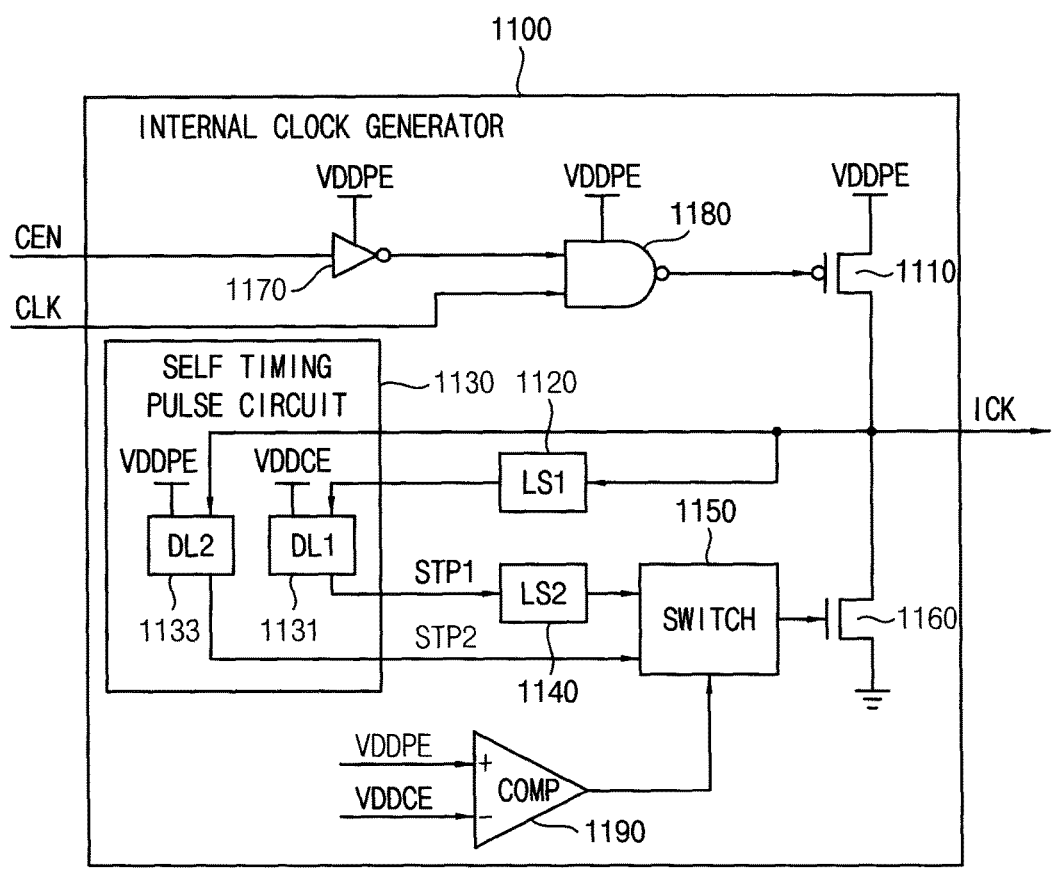
FIG. 13 is a block diagram illustrating an example of an internal clock generator included in a volatile memory device of FIG. 12.

FIG. 12 is a block diagram illustrating a volatile memory device according to at least some example embodiments of the inventive concepts, and FIG. 13 is a block diagram illustrating an example of an internal clock generator included in a volatile memory device of FIG. 12.

Referring to FIGS. 12 and 13, a volatile memory device 1000 includes a memory cell array 1010 that stores data, and a peripheral circuit 1020 that controls the memory cell array 1010. The memory cell array 1010 and the peripheral circuit 1020 may be supplied with different first and second power supply voltages VDDCE and VDDPE. The peripheral circuit 1020 may include, for example, the following circuits: a row decoder 1030, a data write/read unit 1040 and a control circuit 1050. The volatile memory device 1000 of FIG. 12 may have a similar configuration to a volatile memory device 400 of FIG. 6, except for configurations of an internal clock generator 1100, a comparator 1190 and a self timing pulse circuit 1130.

The internal clock generator 1100 may compare a voltage level of the first power supply voltage VDDCE and a voltage level of the second power supply voltage VDDPE, and may selectively adjust a pulse width of an internal clock signal ICK depending on a result of the comparison. For example, the internal clock generator 1100 may generate the internal clock signal ICK based on the second power supply voltage VDDPE without adjusting the pulse width of the internal clock signal ICK when the voltage level of the first power supply voltage VDDCE is higher than the voltage level of the second power supply voltage VDDPE, and may adjust the pulse width of the internal clock signal ICK according to the voltage level of the first power supply voltage VDDCE when the voltage level of the first power supply voltage VDDCE is lower than the voltage level of the second power supply voltage VDDPE.

As illustrated in FIG. 13, the internal clock generator 1100 may include a pull-up transistor 1110, a first level shifter 1120, a self timing pulse circuit 1130, a second level shifter 1140, a switch 1150 and a pull-down transistor 1160. In some example embodiments, the internal clock generator 1100 may further include an inverter 1170 and a NAND gate 1180. The internal clock generator 1100 of FIG. 13 may have a similar configuration and a similar operation to an internal clock generator 900 of FIG. 9, except that the internal clock generator 1100 of FIG. 13 further includes the comparator 1190 and that one of first and second self timing pulses STP1 and SPT2 is selected in response to an output signal of the comparator 1190.

The comparator 1190 may compare the voltage level of the first power supply voltage VDDCE and the voltage level of the second power supply voltage VDDPE. For example, the comparator 1190 may generate an output signal having a first logic level when the voltage level of the first power supply voltage VDDCE is higher than the voltage level of the second power supply voltage VDDPE, and may generate the output signal having a second logic level when the voltage level of the first power supply voltage VDDCE is lower than the voltage level of the second power supply voltage VDDPE. The switch 1150 may select the second self timing pulse STP2 in response to the output signal of the comparator 1190 having the first logic level, and may select the first self timing pulse STP1 in response to the output signal of the comparator 1190 having the second logic level. Accordingly, when the voltage level of the first power supply voltage VDDCE is lower than the voltage level of the second power supply voltage VDDPE, the pulse width of the internal clock signal ICK may be adjusted according to the voltage level of the first power supply voltage VDDCE.

Figure 14:
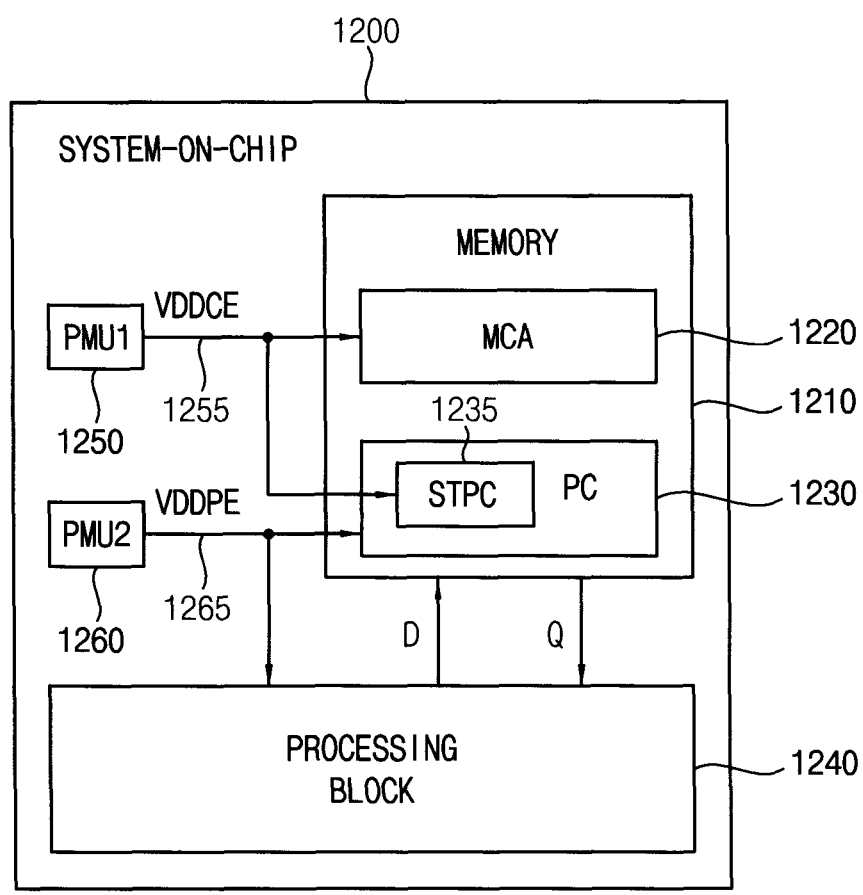
FIG. 14 is a block diagram illustrating a system-on-chip (SoC) including a volatile memory device according to at least some example embodiments of the inventive concepts.

FIG. 14 is a block diagram illustrating a system-on-chip (SoC) including a volatile memory device according to at least some example embodiments of the inventive concepts.

Referring to FIG. 14, a system-on-chip 1200 may include a volatile memory device 1210, a processing block 1240 and first and second power management units 1250 and 1260. In some example embodiments, the system-on-chip 1200 may be an application processor (AP).

The processing block 1240 may be, for example, a processor. The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multiprocessor, an application-specific integrated circuit (ASIC), and a field programmable gate array (FPGA).

The volatile memory device 1210 includes a memory cell array 1220 that stores data, and a peripheral circuit (PC) 1230 that controls the memory cell array (MCA) 1220. In some example embodiments, the volatile memory device 1210 may be a static random access memory (SRAM) device. The processing block 1240 may provide data D to the volatile memory device 1210 to store the data D in the memory cell array 1220, and may receive data Q stored in the memory cell array 1220 from the volatile memory device 1210.

In some example embodiments, the first power management unit 1250 may be a circuit that supplies the memory cell array 1220 of the volatile memory device 1210 with a first power supply voltage VDDCE through a first power supply line 1255. The second power management unit 1260 may be a circuit that supplies the processing block 1240 and the peripheral circuit 1230 of the volatile memory device 1210 with a second power supply voltage VDDPE through a second power supply line 1265.

In some example embodiments, the peripheral circuit 1230 may include a self timing pulse circuit (STPC) 1235 that determines an operation timing (or an operation speed) of the peripheral circuit 1230. The self timing pulse circuit 1235 may be supplied with the first power supply voltage VDDCE from the first power management unit 1250 through the first power supply line 1255. The self timing pulse circuit 1235 may adjust the operation timing of the peripheral circuit 1230 according to a voltage level of the first power supply voltage VDDCE. Thus, since the self timing pulse circuit 1235 is supplied with the first power supply voltage VDDCE that is supplied to the memory cell array 1210, the operation stability of the volatile memory device 1210 may be achieved while the operation performance of the volatile memory device 1210 may be maintained or improved.

In other example embodiments, the peripheral circuit 1230 may include an internal clock generator that generates an internal clock signal having a pulse width that is adjusted according to the voltage level of the first power supply voltage VDDCE. The internal clock generator may include or use the self timing pulse circuit 1235 to adjust the operation timing (or the operation speed) of the peripheral circuit 1230 to correspond to the operation characteristic of the memory cell array 1210. Thus, since the internal clock generator adjust the pulse width of the internal clock signal based on the first power supply voltage VDDCE supplied to the memory cell array 1210, the operation stability of the volatile memory device 1210 may be achieved while the operation performance of the volatile memory device 1210 may be maintained or improved.

Figure 15:
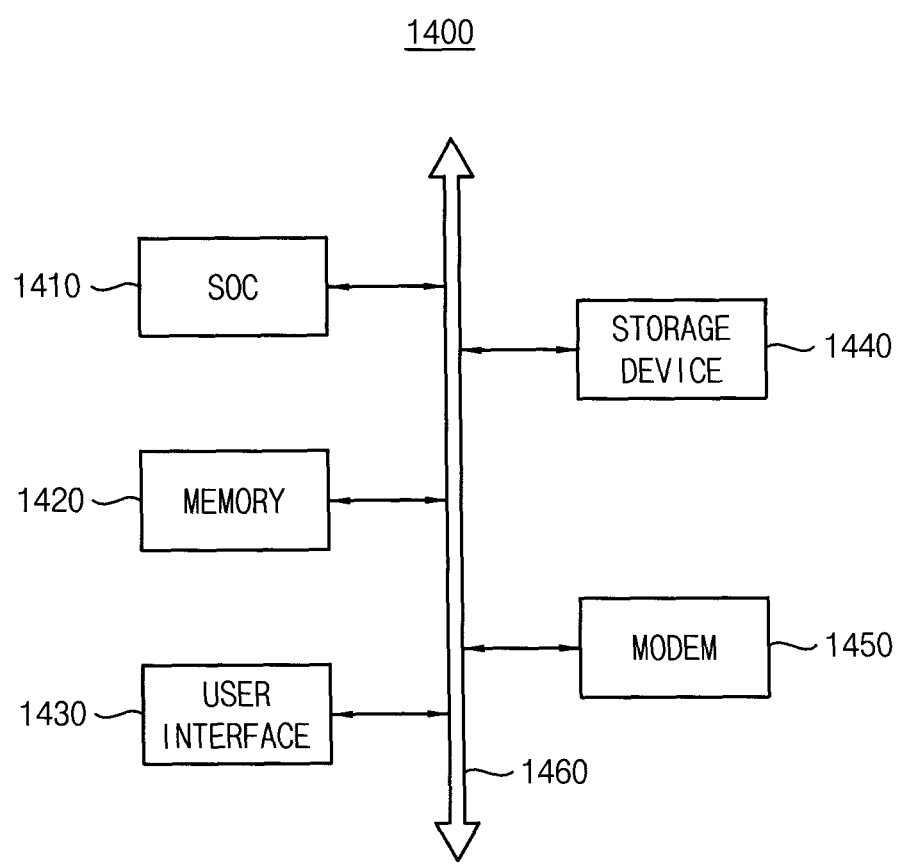
FIG. 15 is a block diagram illustrating an electronic device including a system-on-chip according to at least some example embodiments of the inventive concepts.

FIG. 15 is a block diagram illustrating an electronic device including a system-on-chip according to at least some example embodiments of the inventive concepts.

Referring to FIG. 15, an electronic device 1400 may include a system-on-chip (e.g., a mobile SoC) 1410, a memory device 1420, a user interface 1430, a storage device 1440, a modem (e.g., a baseband chipset) 1450 and a bus 1460.

The system-on-chip 1410 may perform specific calculations and/or tasks. For example, the system-on-chip 1410 may be an application processor, a mobile SoC, a media processor, a microprocessor, a central process unit (CPU), or the like. The system-on-chip 1410 may communicate with the memory device 1420 via the bus 1460, such as an address bus, a control bus and/or a data bus. The memory device 1420 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), and/or a ferroelectric random access memory (FRAM), among others. The system-on-chip 1410 may control the user interface 1430 including at least one input device, such as a keyboard, a mouse, a keypad, etc., and at least one output device, such as a printer, a display device, or the like. The system-on-chip 1410 may further control the storage device 1440, such as a solid state drive, a hard disk drive, a CD-ROM, or the like. The modem 1450 may perform wired or wireless communications with external devices. The electronic device 1400 may further include a power supply for supplying the electronic device 1400 with power. In some example embodiments, the electronic device 1400 may further include an application chipset, a camera image sensor (CIS), or the like.

In some example embodiments, the system-on-chip 1410 may be packaged in various desired forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP) and/or wafer-level processed stack package (WSP), among others.

The electronic device 1400 may be any electronic device, such as a digital camera, a mobile phone, a smart phone, a personal digital assistants (PDA), a portable multimedia player (PMP), a personal computer, a server computer, a workstation, a laptop computer, a digital television, a set-top box, a music player, a portable game console, and/or a navigation system among others.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Such modifications are not to be regarded as a departure from the intended spirit and scope of example embodiments of the inventive concepts, and all such modifications as would be obvious to one skilled in the art are intended to be included within the scope of the following claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A volatile memory device comprising:
   a memory cell array including a plurality of memory cells, each memory cell configured to be supplied with a first power supply voltage through a first power supply line, and configured to store data based on the first power supply line; and
   a peripheral circuit being supplied with a second power supply voltage through a second power supply line, and configured to control the memory cell array based on the second power supply line, the peripheral circuit including an internal clock generator configured to generate an internal clock signal having a pulse width that is adjusted according to a voltage level of the first power supply voltage,
   wherein the internal clock generator is configured to,
      decrease the pulse width of the internal clock signal as the voltage level of the first power supply voltage increases, and
      increase the pulse width of the internal clock signal as the voltage level of the first power supply voltage decreases, and wherein the internal clock generator includes:
  a pull-up transistor configured to pull up the internal clock signal to a voltage level of the second power supply voltage in response to an external clock signal;
  a first level shifter configured to convert a voltage level of the internal clock signal from the voltage level of the second power supply voltage to the voltage level of the first power supply voltage;
  a self-timing pulse circuit being configured to be supplied with the first power supply voltage through the first power supply line, and configured to generate a self-timing pulse by delaying the internal clock signal having the voltage level of the first power supply voltage;
  a second level shifter configured to convert a voltage level of the self-timing pulse from the voltage level of the first power supply voltage to the voltage level of the second power supply voltage; and
  a pull-down transistor configured to pull down the internal clock signal to a voltage level of a ground voltage in response to the self-timing pulse having the voltage level of the second power supply voltage.

2. The volatile memory device of claim 1, wherein the self-timing pulse circuit adjusts the pulse width of the internal clock signal according to the voltage level of the first power supply voltage.

3. The volatile memory device of claim 2, wherein the self-timing pulse circuit is configured to,
  advance an operation timing of the peripheral circuit as the voltage level of the first power supply voltage increases, and
  delay the operation timing of the peripheral circuit as the voltage level of the first power supply voltage decreases.

4. The volatile memory device of claim 2, wherein the self-timing pulse circuit is configured to delay a start timing of a sensing operation for reading the data stored in the memory cell array as the voltage level of the first power supply voltage decreases.

5. The volatile memory device of claim 2, wherein the self-timing pulse circuit is configured to delay an end timing of a write operation for writing the data into the memory cell array as the voltage level of the first power supply voltage decreases.

6. The volatile memory device of claim 1, wherein the self-timing pulse circuit includes:
  a delay line, the delay line being configured to,
    receive the first power supply voltage through the first power supply line,
    receive the internal clock signal having the voltage level of the first power supply voltage from the first level shifter, and
    generate the self-timing pulse by delaying the internal clock signal having the voltage level of the first power supply voltage.

7. The volatile memory device of claim 6, wherein the delay line includes:
  a plurality of serially connected buffers configured to receive the first power supply voltage through the first power supply line.

8. The volatile memory device of claim 1, wherein the internal clock generator further includes:
  an inverter configured to invert a chip enable signal; and
  a NAND gate configured to perform a NAND operation on the inverted chip enable signal and the external clock signal, the NAND gate having an output terminal coupled to a gate terminal of the pull-up transistor.

9. The volatile memory device of claim 1, wherein the internal clock generator is configured to selectively adjust the pulse width of the internal clock signal in response to a write enable signal such that,
  the internal clock generator generates the internal clock signal based on the second power supply voltage when the write enable signal indicates a write mode, and
  the internal clock generator adjusts the pulse width of the internal clock signal according to the voltage level of the first power supply voltage when the write enable signal indicates a read mode.

10. The volatile memory device of claim 1, wherein the internal clock generator is configured to selectively adjust the pulse width of the internal clock signal in response to a pulse control signal received from an external processing block such that,
  the internal clock generator generates the internal clock signal based on the second power supply voltage when the pulse control signal has a first logic level, and
  the internal clock generator adjusts the pulse width of the internal clock signal according to the voltage level of the first power supply voltage when the pulse control signal has a second logic level.

11. The volatile memory device of claim 1, wherein the internal clock generator is configured to compare the voltage level of the first power supply voltage with a voltage level of the second power supply voltage, and configured to selectively adjust the pulse width of the internal clock signal according to a result of the comparison such that,
  the internal clock generator generates the internal clock signal based on the second power supply voltage when the voltage level of the first power supply voltage is higher than the voltage level of the second power supply voltage, and
  the internal clock generator adjusts the pulse width of the internal clock signal according to the voltage level of the first power supply voltage when the voltage level of the first power supply voltage is lower than the voltage level of the second power supply voltage.

12. A system-on-chip comprising:
  a volatile memory device including a memory cell array configured to store data, and a peripheral circuit configured to control the memory cell array;
  a processing block configured to provide the data to the volatile memory device to store the data in the memory cell array, and configured to receive the data stored in the memory cell array from the volatile memory device;
  a first power management unit configured to supply a first power supply voltage to memory cells of the memory cell array of the volatile memory device through a first power supply line; and
  a second power management unit configured to supply a second power supply voltage to the processing block and the peripheral circuit of the volatile memory device through a second power supply line,
  wherein the peripheral circuit includes an internal clock generator configured to generate an internal clock signal having a pulse width that is adjusted according to a voltage level of the first power supply voltage,
  wherein the internal clock generator is configured to,
    decrease the pulse width of the internal clock signal as the voltage level of the first power supply voltage increases, and increase the pulse width of the internal clock signal as the voltage level of the first power supply voltage decreases, and wherein the internal clock generator includes:
- a pull-up transistor configured to pull up the internal clock signal to a voltage level of the second power supply voltage in response to an external clock signal;
- a first level shifter configured to convert a voltage level of the internal clock signal from the voltage level of the second power supply voltage to the voltage level of the first power supply voltage,
- a self-timing pulse circuit being configured to he supplied with the first power supply voltage through the first power supply line, and configured to generate a self-timing pulse by delaying the internal clock signal having the voltage level of the first power supply voltage;
- a second level shifter configured to convert a voltage level of the self-timing pulse from the voltage level of the first power supply voltage to the voltage level of the second power supply voltage; and
- a pull-down transistor configured to pull down the internal clock signal to a voltage level of a ground voltage in response to the self-timing pulse having the voltage level of the second power supply voltage.

13. The system-on-chip of claim 12, wherein the volatile memory device is a static random access memory (SRAM) device.

14. The system-on-chip of claim 12, wherein the system-on-chip is an application processor (AP).

15. A volatile memory device comprising:
- a memory cell array including a plurality of memory cells, each memory cell configured to be supplied with a first power supply voltage through a first power supply line; and
- a peripheral circuit configured to be supplied with a second power supply voltage through a second power supply line, the peripheral circuit including an internal clock generator, wherein the internal clock generator includes:
- a pull-up transistor configured to pull up an internal clock signal to a voltage level of the second power supply voltage in response to an external clock signal;
- a first level shifter configured to convert a voltage level of the internal clock signal from the voltage level of the second power supply voltage to a voltage level of the first power supply voltage;
- a self-timing pulse circuit being configured to be supplied with the first power supply voltage through the first power supply line, and configured to generate a self-timing pulse by delaying the internal clock signal having the voltage level of the first power supply voltage;
- a second level shifter configured to convert a voltage level of the self-timing pulse from the voltage level of the first power supply voltage to the voltage level of the second power supply voltage; and
- a pull-down transistor configured to pull down the internal clock signal to a voltage level of a ground voltage in response to the self-timing pulse having the voltage level of the second power supply voltage, and wherein the self-timing pulse circuit is configured to determine an operation timing of the peripheral circuit, and is further configured to adjust the operation timing of the peripheral circuit according to the voltage level of the first power supply voltage.

16. The volatile memory device of claim 15, wherein the internal clock generator is configured to generate the internal clock signal having a pulse width that is adjusted according to the voltage level of the first power supply voltage.

17. The volatile memory device of claim 15, wherein the self-timing pulse circuit is configured to,
- advance the operation timing of the peripheral circuit as the voltage level of the first power supply voltage increases, and
- delay the operation timing of the peripheral circuit as the voltage level of the first power supply voltage decreases.

* * * * *